US010761627B2

(12) United States Patent
Kim et al.

(10) Patent No.: US 10,761,627 B2
(45) Date of Patent: Sep. 1, 2020

(54) ELECTRONIC DEVICE WITH DISPLAY

(71) Applicant: Samsung Electronics Co., Ltd., Suwon-si, Gyeonggi-do (KR)

(72) Inventors: Seong Hoon Kim, Seoul (KR); Jaewan Kim, Suwon-si (KR); Min-Sung Lee, Suwon-si (KR); Min-Su Jung, Seoul (KR); Dohyung Ha, Seoul (KR); Sung-Won Hong, Hwaseong-si (KR); Kwang-Tai Kim, Suwon-si (KR); Hyungsup Byeon, Suwon-si (KR); Donghyun Yeom, Bucheon-si (KR); Seung Ah Oh, Seoul (KR); Min-Woo Yoo, Osan-si (KR); Jungwon Lee, Anyang-si (KR); Jong-Chul Choi, Suwon-si (KR); Hyun-Ju Hong, Osan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 51 days.

(21) Appl. No.: 16/028,996

(22) Filed: Jul. 6, 2018

(65) Prior Publication Data
US 2019/0012007 A1    Jan. 10, 2019

(30) Foreign Application Priority Data

Jul. 6, 2017    (KR) .......................... 10-2017-0085876

(51) Int. Cl.
*G06F 3/041* (2006.01)
*G06K 9/22* (2006.01)
(Continued)

(52) U.S. Cl.
CPC ............ *G06F 3/041* (2013.01); *G06F 1/1626* (2013.01); *G06F 1/1635* (2013.01);
(Continued)

(58) Field of Classification Search
CPC ...... G06F 3/0421; G06F 3/0414; G06F 3/041; G06F 3/042; G06F 2203/04105;
(Continued)

(56) References Cited

U.S. PATENT DOCUMENTS 9,195,108 B2 * 11/2015 Park .................. G02F 1/136286
9,939,699 B2 *  4/2018 Park .................. G02F 1/136286
(Continued)

FOREIGN PATENT DOCUMENTS

CN        205621016 U      10/2016
EP        3 054 655 A1      8/2016
(Continued)

OTHER PUBLICATIONS

European Search Report dated Nov. 13, 2018, issued in European Patent Application No. 18182289.1.
(Continued)

*Primary Examiner* — Vijay Shankar
(74) *Attorney, Agent, or Firm* — Jefferson IP Law, LLP

(57) ABSTRACT

An electronic device for widening an active area of a display is provided. The electronic device includes a housing including a first plate and a second plate facing away from the first plate, a touch screen display including a first glass plate, a second glass plate, and an organic light-emitting diode (OLED) layer interposed between the first plate and the second plate, a flexible layer including a first portion connected to the first surface of the second glass plate and bent around an edge of the second glass plate toward the second plate of the housing, and a second portion extending from the first portion and interposed between the second glass plate and the second plate of the housing, a display driver integrated circuit (DDIC) mounted on a first surface of the second portion of the flexible layer, and a printed circuit
(Continued)

board (PCB) including a portion mounted on a second surface of the second portion of the flexible layer.

14 Claims, 52 Drawing Sheets

(51) Int. Cl.

| | |
|---|---|
| *G06F 1/16* | (2006.01) |
| *G06F 1/18* | (2006.01) |
| *G06K 9/20* | (2006.01) |
| *G06F 3/02* | (2006.01) |
| *G06K 9/00* | (2006.01) |
| *G09G 3/3208* | (2016.01) |
| *H01L 27/32* | (2006.01) |
| *H01L 51/00* | (2006.01) |
| *H01L 51/52* | (2006.01) |

(52) U.S. Cl.
CPC .......... *G06F 1/1637* (2013.01); *G06F 1/1643* (2013.01); *G06F 1/1652* (2013.01); *G06F 1/183* (2013.01); *G06F 3/02* (2013.01); *G06K 9/00013* (2013.01); *G06K 9/209* (2013.01); *G06K 9/22* (2013.01); *G09G 3/3208* (2013.01); *H01L 27/323* (2013.01); *H01L 27/3225* (2013.01); *H01L 27/3234* (2013.01); *H01L 51/0097* (2013.01); *H01L 51/529* (2013.01); *G06F 2203/04102* (2013.01); *G06F 2203/04103* (2013.01); *G06F 2203/04105* (2013.01); *G09G 2300/0408* (2013.01); *H01L 2251/5338* (2013.01)

(58) Field of Classification Search
CPC ............ G06F 2203/04102; G06F 2203/04103; G09G 3/3208; G09G 2300/0408
See application file for complete search history.

(56) References Cited

U.S. PATENT DOCUMENTS

| | | | |
|---|---|---|---|
| 2003/0020152 | A1 | 1/2003 | Inoue et al. |
| 2012/0050958 | A1 | 3/2012 | Sanford et al. |
| 2014/0055702 | A1* | 2/2014 | Park .................. G02F 1/136286 349/43 |
| 2015/0092362 | A1 | 4/2015 | Ahn |
| 2015/0296607 | A1 | 10/2015 | Yang et al. |
| 2016/0056299 | A1 | 2/2016 | Honda et al. |
| 2016/0218053 | A1 | 7/2016 | Cho et al. |
| 2016/0218289 | A1 | 7/2016 | Lee et al. |
| 2016/0306488 | A1* | 10/2016 | Kim ..................... G06F 3/0416 |

FOREIGN PATENT DOCUMENTS

| | | |
|---|---|---|
| JP | 2006-235251 A | 9/2006 |
| KR | 10-2015-0037196 A | 4/2015 |
| KR | 10-2016-0141254 A | 12/2016 |

OTHER PUBLICATIONS

Extended European Search Report dated Mar. 7, 2019, issued in European Patent Application No. 18182289.1.
Indian Office Action dated Jun. 26, 2020; Indian Appln. No. 201824025296.

\* cited by examiner

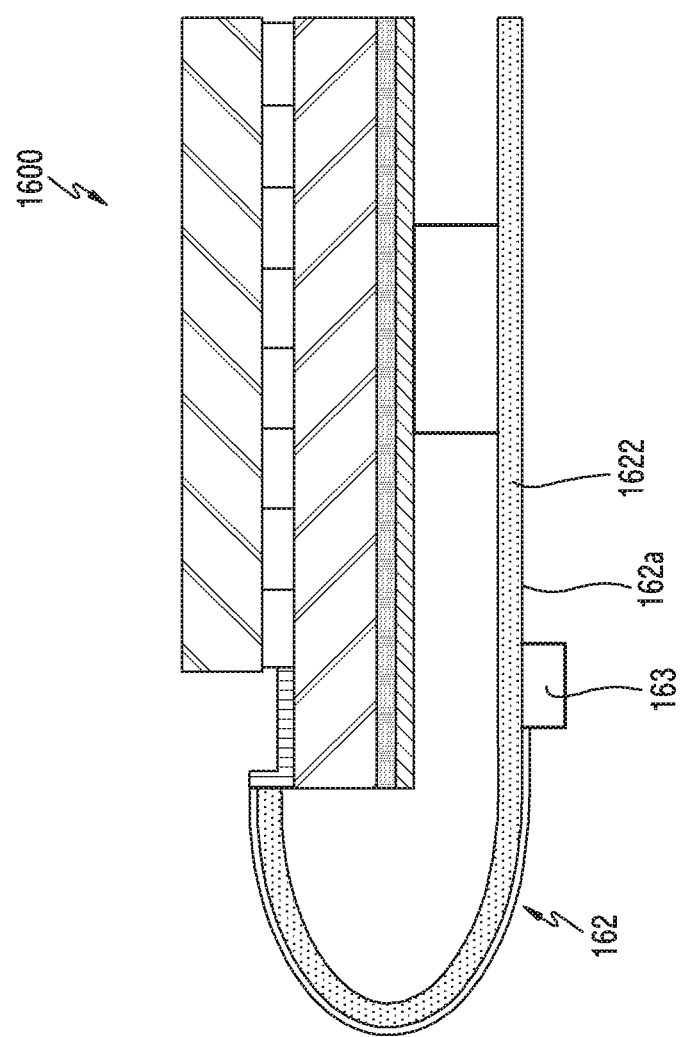

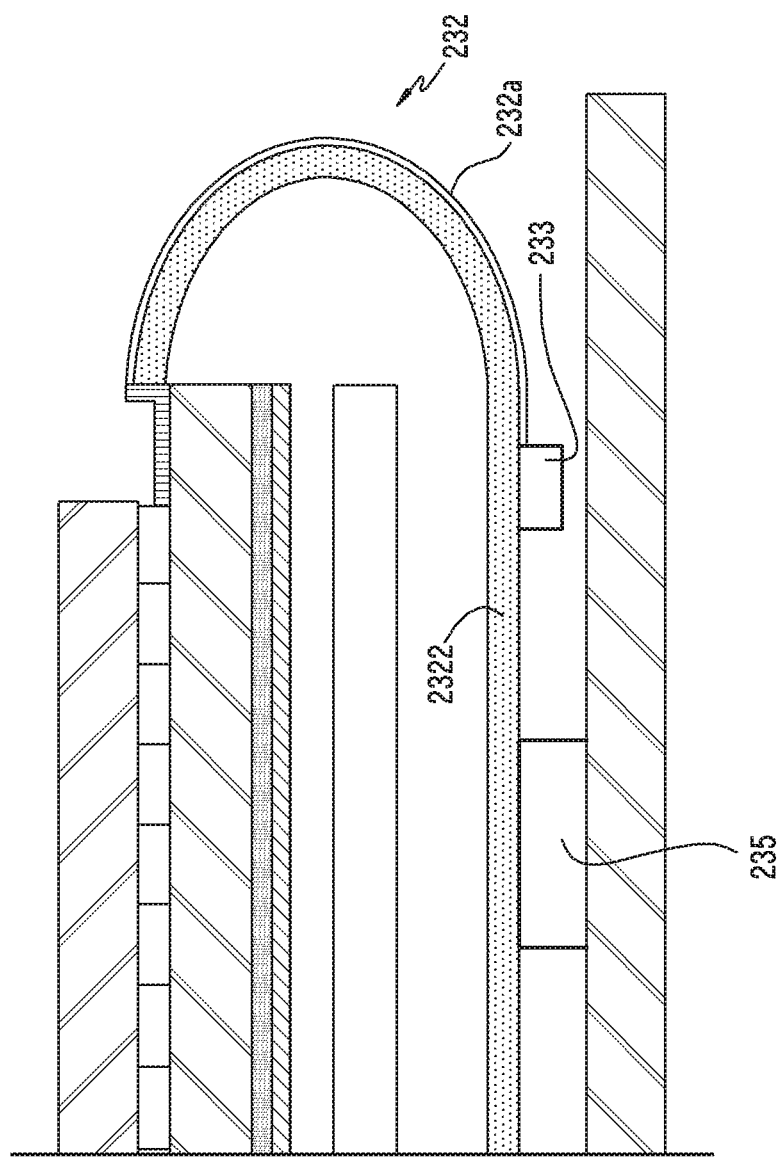

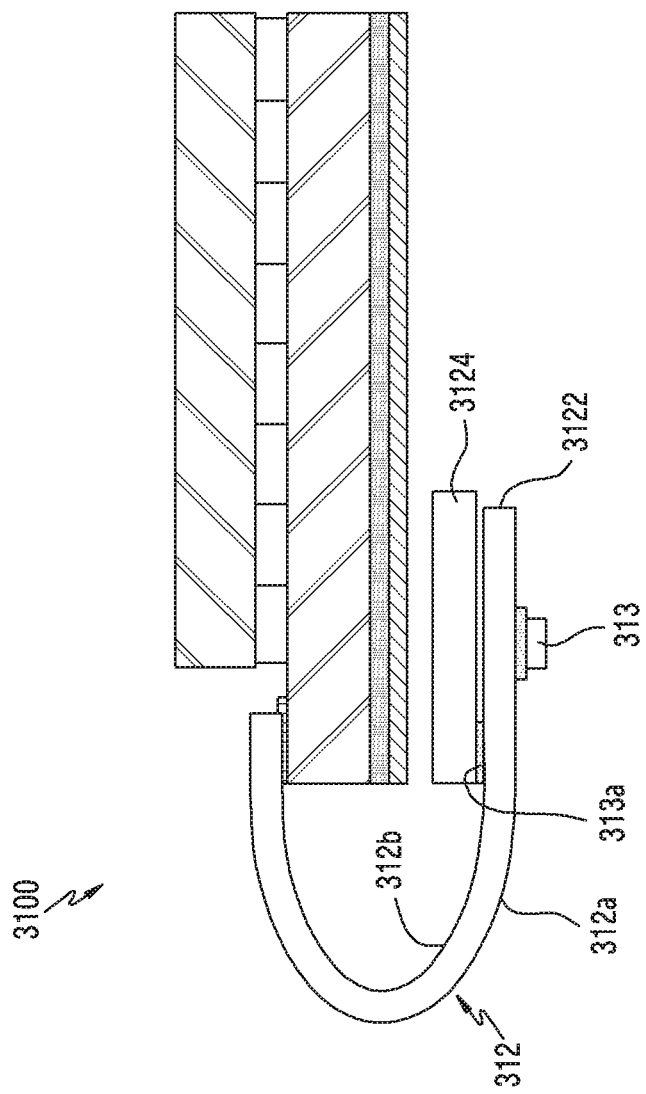

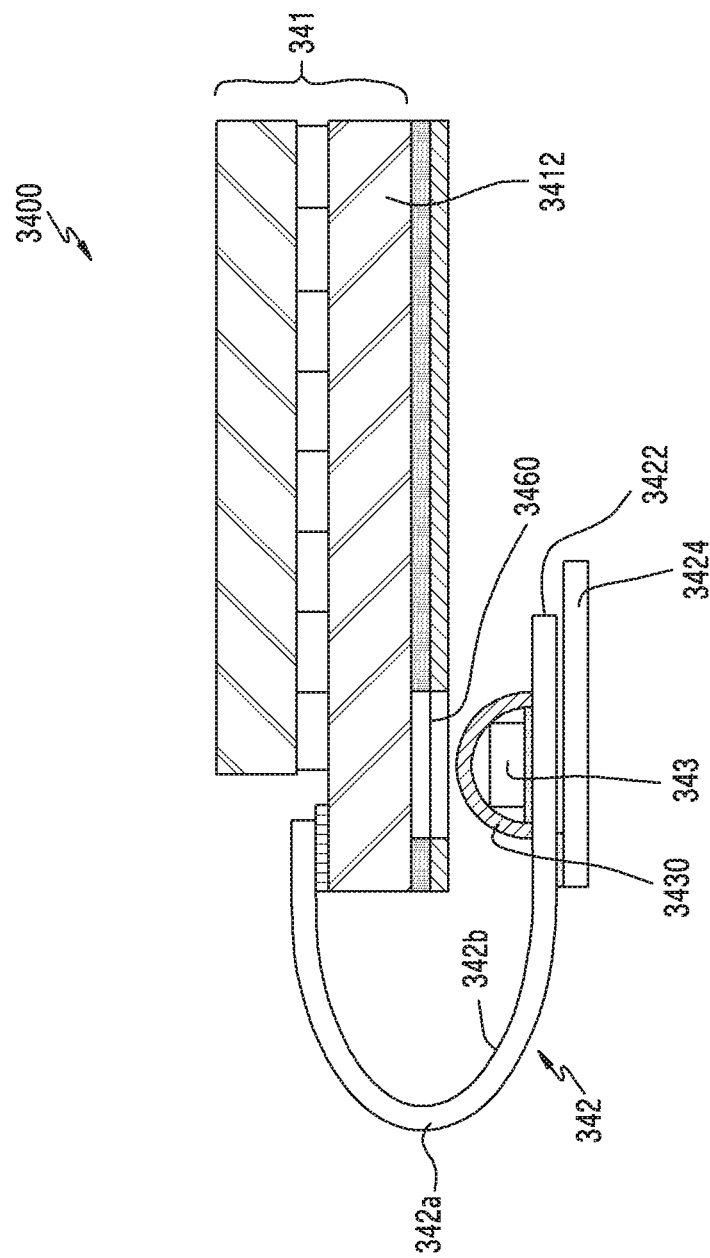

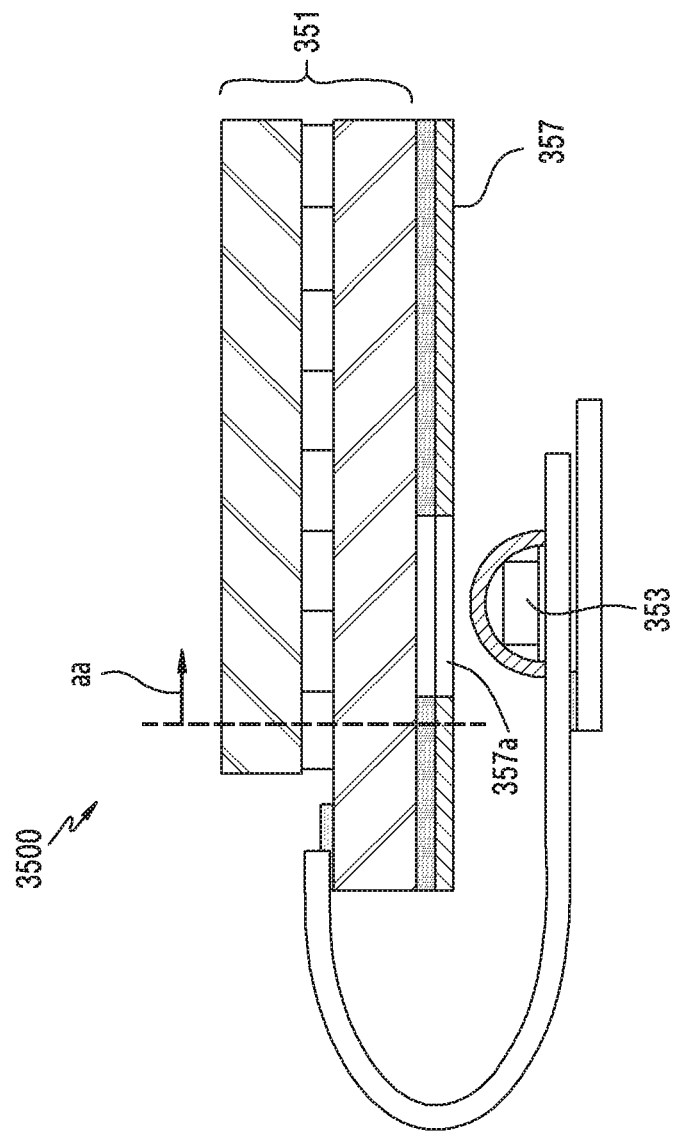

ELECTRONIC DEVICE WITH DISPLAY

CROSS-REFERENCE TO RELATED APPLICATION(S)

This application is based on and claims priority under 35 U.S.C. § 119(a) of a Korean patent application number 10-2017-0085876, filed on Jul. 6, 2017, in the Korean Intellectual Property Office, the disclosure of which is incorporated by reference herein in its entirety.

BACKGROUND

1. Field

The disclosure relates to an electronic device including a display.

2. Description of Related Art

An ordinary electronic device has a display (e.g., a touch-screen display) disposed on a front face thereof, and efforts are being made to increase the proportion occupied by an active area where a screen is displayed in the entire display area on the disposed display.

Further, the electronic device may include a fingerprint sensor or a pressure sensor, and the display region and the fingerprint sensor region may be distinguished from each other.

The above information is presented as background information only to assist with an understanding of the disclosure. No determination has been made, and no assertion is made, as to whether any of the above might be applicable as prior art with regard to the disclosure.

SUMMARY

Therefore, a component mounting structure related to a display may be insufficient in the mounting space of a display driver integrated circuit (DDIC), a fingerprint sensor, or a pressure sensor, and there may be a restriction particularly in utilizing a display region.

Further, in the structure in which the display mounting structure implements the front face of the electronic device as a full display, there may be a limit in reducing the black matrix (BM) region.

Aspects of the disclosure are to address at least the above-mentioned problems and/or disadvantages and to provide at least the advantages described below. Accordingly, an aspect of the disclosure is to provide a method of disposing a DDIC, a fingerprint sensor, or a pressure sensor for utilizing a mounting space in a DDIC or an electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate and a second plate facing away from the first plate, a touch screen display including a first glass plate, a second glass plate, and an organic light-emitting diode (OLED) layer interposed between the first plate and the second plate, wherein the first glass plate is interposed between the first plate of the housing and the OLED layer, and wherein the second glass plate includes a first surface facing toward the first plate and a second surface facing toward second plate, a flexible layer including a first portion connected to the first surface of the second glass plate and bent around an edge of the second glass plate toward the second plate of the housing, and a second portion extending from the first portion and interposed between the second glass plate and the second plate of the housing, a DDIC mounted on a first surface of the second portion of the flexible layer, and a printed circuit board (PCB) including a portion mounted on a second surface of the second portion of the flexible layer, wherein the DDIC is interposed between the portion of the PCB and the second surface of the second glass plate.

In accordance with another aspect of the disclosure, an electronic device is provided. The electronic device includes a housing including a first plate facing in a first direction, and a second plate facing in a second direction, which is opposite to the first direction, wherein the first plate and the second plate face away from each other, a touch screen display including a first film, a second film, and an OLED layer interposed between the first film and the second film, wherein the first film is interposed between the first plate of the housing and the OLED layer, and wherein the second film includes a first face facing toward the first plate and a second face facing toward second plate, a first flexible circuit board including a first portion connected to the first face of the second film and bent around an edge of the second film toward the second plate of the housing, and a second portion extending from the first portion and interposed between the second film and the second plate of the housing, a touch screen DDIC mounted on the second portion, and a PCB disposed to be spaced apart from and parallel to the second portion.

An electronic device according to an embodiment of the disclosure can enhance the mounting efficiency of components included in an electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 11, 12, 13, 14, 15, and 16 are cross-sectional views each illustrating an electronic device in which a display and sensors are disposed according to various embodiments of the disclosure;

FIGS. 21, 22, and 23 are cross-sectional views each illustrating an electronic device in which a display and sensors are disposed according to various embodiments of the disclosure;

FIG. 31A is a cross-sectional view illustrating an electronic device in which a display and sensors are disposed according to various embodiments of the disclosure;

FIG. 34A is a cross-sectional view illustrating an electronic device in which a display and sensors are disposed according to various embodiments of the disclosure;

FIG. 35A is a cross-sectional view illustrating an electronic device in which a display and sensors are disposed according to various embodiments of the disclosure.

Throughout the drawings, it should be noted that like reference numbers are used to depict the same or similar elements, features, and structures.

DETAILED DESCRIPTION

Figure 1A:
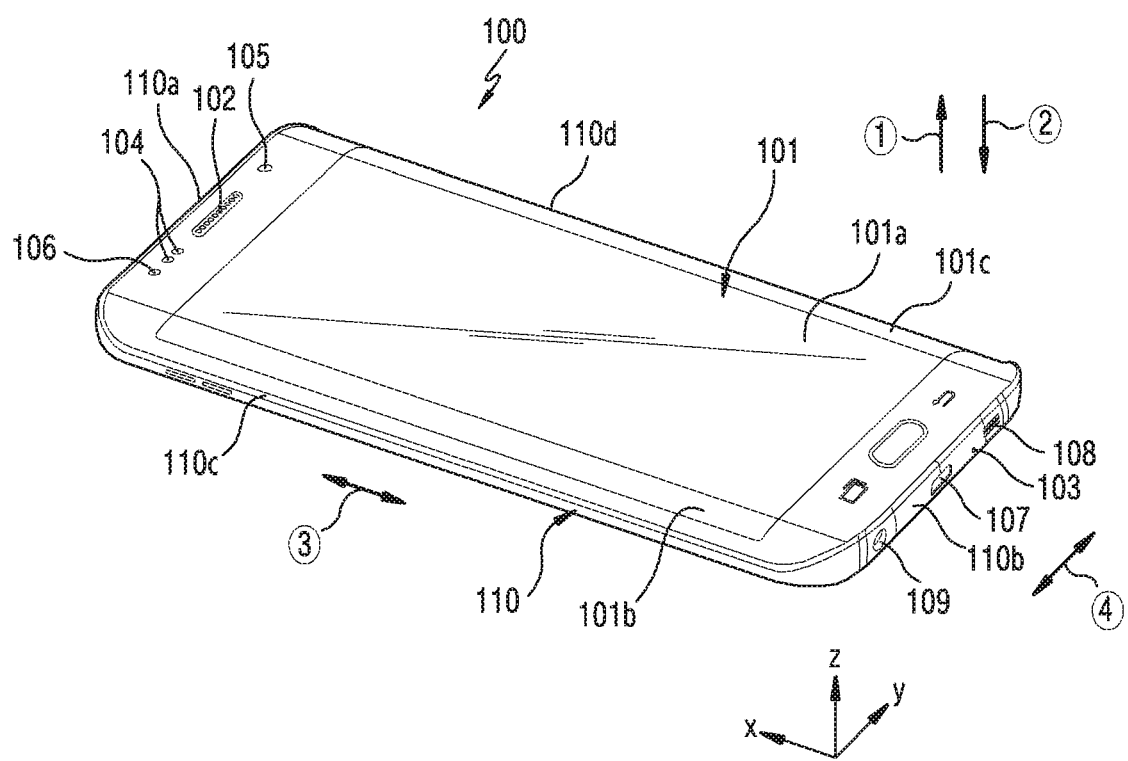
FIG. 1A is a perspective view illustrating the front face of an electronic device according to various embodiments of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the disclosure, but do not limit the elements. For example, such terms do not limit the order and/or priority of the elements. Furthermore, such terms may be used to distinguish one element from another element. For example, "a first user device" and "a second user device" indicate different user devices regardless of the order or priority. For example, without departing from the scope of the disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the disclosure are used to describe specified embodiments of the disclosure and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the disclosure. In some cases, even if terms are terms which are defined in the specification, they may not be interpreted to exclude embodiments of the disclosure.

An electronic device according to various embodiments of the disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) audio layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disc (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the disclosure are not limited to the above-mentioned devices, and may include new electronic devices according to technology development.

Figure 1B:
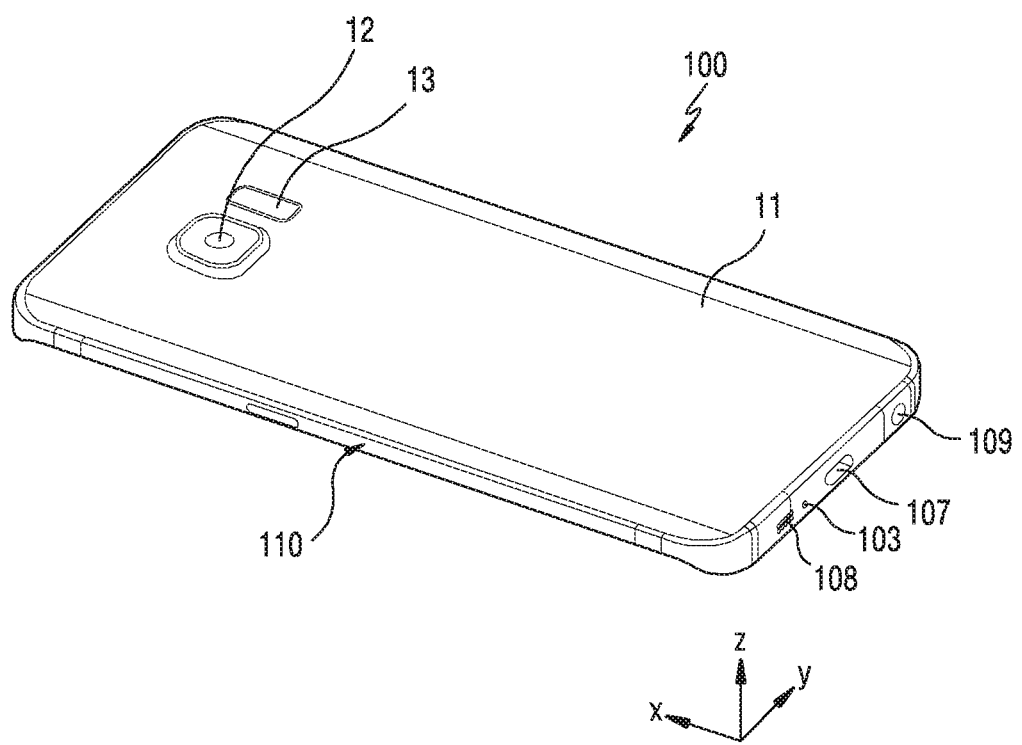
FIG. 1B is a perspective view illustrating the rear face of the electronic device according to various embodiments of the disclosure.

FIG. 1A is a perspective view illustrating the front face of an electronic device according to various embodiments of the disclosure. FIG. 1B is a perspective view illustrating the rear face of an electronic device according to various embodiments of the disclosure. An orthogonal coordinate system is used, in which an X axis direction may mean the transverse direction of the electronic device, a Y axis may mean the longitudinal direction of the electronic device, and a Z axis may mean the thickness direction of the electronic device.

Referring to FIGS. 1A and 1B, an electronic device 100 according to various embodiments may include a housing 110 that forms the external appearance of an electronic device 100 and protects electronic components of the electronic device 100. The housing 110 according to various embodiments may include a first face that faces in a first direction ①, a second surface that faces in a second direction ②, which is opposite to the first direction ①, and may include a side face that faces in a lateral direction, which is perpendicular to the first and second directions ① and ② and at least partially encloses a space between the first and second faces. The lateral direction may include a third direction ③, a fourth direction θ, or both of the third and fourth directions 3 and 0. The first face of the housing 110 may be configured with a first plate and the second face of the housing 110 may be configured with a second plate.

In the housing 110 according to various embodiments, when the first direction 1̂ faces upward, the first face may be the top face of the housing, and when the second direction ② faces downward, the second face may be the rear face of the housing. In the housing 110 according to various embodiments, for example, when the first direction ① faces upward, the first face may be the front face of the housing, and when the second direction ② faces downward, the second face may be the rear face of the housing.

According to various embodiments, the housing 110 may include a plurality of side faces. For example, the side faces may include a side face on the upper edge 110a of the housing 110, a side face on the lower edge 110b of the housing, a side face on the left edge 110c of the housing, and a side face on the right edge 110d of the housing. The upper edge 110a, the lower edge 110b, the left edge 110c, and the right edge 110d may constitute a rim or a perimeter of the electronic device 100 together.

According to various embodiments, the electronic device 100 may include a single display 101. The single display 101 according to various embodiments may include a flat display 101a and one or more curved displays 101b and 101c disposed in one or more edge regions of the flat display 101a. For example, the display 101 may occupy at least 50% or more of the area of the housing 110. According to various embodiments, the display 101 may include a display module and a transparent member (e.g., a glass cover or a transparent window). The display module may include a display panel and a touch panel. The flat display 101a and the curved displays 101b and 101c may be configured with a single flexible type display module.

In the flat display 101 according to various embodiments, first and second curved displays 101b and 101c may be disposed in peripheral portions, that is, left and right edges. Although the first and second curved displays 101b and 101c are illustrated as being disposed at the left and right edges of the flat display 101 in the present embodiment, the curved displays may be disposed at various edge regions without being limited to the above positions.

For example, the curved display may be disposed at the upper edge 110a, the lower edge 110b, the left edge 110c, the right edge 110d of the housing 110, may be disposed each of the upper and lower edges 110a and 110b of the housing, or may be disposed at each of left and right edges 110c and 110d, or the upper, lower, left, and right edges 110a, 110b, 110c, and 110d of the housing. The upper and lower edges 110a and 110b where the first and second curved displays 101b and 101c are not disposed may include a portion of the housing, which is made of a metal. For example, the portion of the housing, which is made of a metal, may be an outer metal frame, and may operate as an antenna radiator by being separated by an insulator.

According to various embodiments, the electronic device 100 may include a receiver 102 disposed so as to output the voice of a communication partner. According to one embodiment, the electronic device 100 may include a microphone device 103 disposed so as to transmit the user's voice to a communication partner.

According to various embodiments, components for conducting various functions of the electronic device 100 may be arranged around the receiver 102 in the electronic device 100. The components may include at least one sensor module 104. The sensor module 104 may include at least one of, for example, an illuminance sensor (e.g., an optical sensor), a proximity sensor (e.g., an optical sensor), an infrared sensor, an ultrasonic sensor, a fingerprint recognition sensor, and an iris recognition sensor. According to various embodiments, the components may include a front camera device 105. According to various embodiments, the components may include an indicator 106 (e.g., an LED device) configured to allow a user to recognize status information of the electronic device.

According to various embodiments, the electronic device 100 may include a speaker device 108, which is disposed on one side of the microphone device 103. The electronic device may include an interface connector port 107, which is disposed on the other side of the microphone device 103, in order to receive a data transmission/reception function from an external device and external power to charge the electronic device 100. According to various embodiments, the electronic device 100 may include an earphone jack assembly 109, which is disposed on one side of the interface connector port 107.

According to various embodiments, the electronic device 100 may include the housing 110. According to various embodiments, the housing 110 may be formed of a conductive member and a non-conductive member. The housing 110 may be disposed along the rim of the electronic device 100 and may extend to at least a portion of the front face or at least a portion of the rear face. The housing 110 may define at least a portion of the thickness of the electronic device 100 along the rim of the electronic device 100, and may be formed in a closed loop shape. Without being limited thereto, however, the housing 110 may be formed in at least a portion of the thickness of the electronic device 100. At least a portion of the housing 110 may be embedded in the electronic device 100.

The electronic device 100 according to various embodiments may include a rear window 11 disposed on a second face (e.g., the rear surface), which is opposite the first face. According to various embodiments, the electronic device 100 may include a rear camera device 12 disposed through the rear window 11. According to various embodiments, the electronic device 100 may include at least one electronic component 13 disposed on one side of the rear camera device 12. According to various embodiments, the electronic components 13 may include at least one of an illuminance sensor (e.g., an optical sensor), a proximity sensor (e.g., an optical sensor), an infrared sensor, an ultrasonic sensor, a heart rate sensor, a flash device, and a fingerprint recognition sensor.

Figure 2:
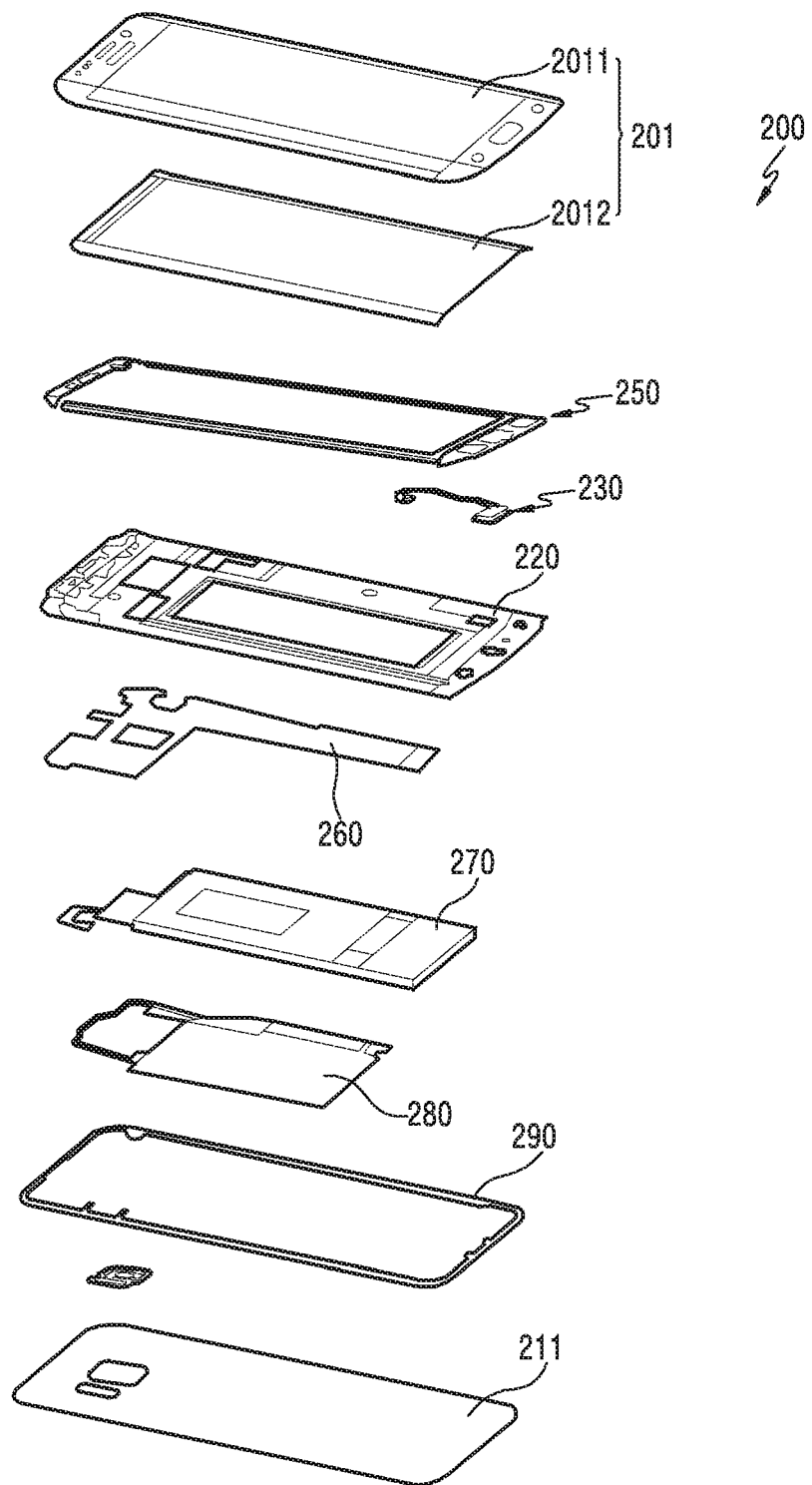
FIG. 2 is an exploded perspective view illustrating an electronic device according to various embodiments of the disclosure.

FIG. 2 is an exploded perspective view of an electronic device according to various embodiments of the disclosure.

The electronic device 200 of FIG. 2 may be similar to the electronic device 100 of FIGS. 1A and 1B, or may include another embodiment of the electronic device.

Referring to FIG. 2, the electronic device 200 (e.g., the electronic device 100) according to various embodiments may include a key input device 230, at least one seal member 250, and a display 201 including a display module 2012 and a window 2011, which are disposed in this order at the upper side with reference to the housing 220. According to various embodiments, the electronic device 200 may include a printed circuit board 260 (e.g., a printed circuit board (PCB), a flexible printed circuit board (FPCB), or a main board), a rechargeable battery 270, a wireless power transmission/reception member 280, a rear seal member 290, and a rear window 211, which are disposed in this order at the lower side with reference to the housing 220. According to various embodiments, the rechargeable battery 270 is seated in an accommodation space formed in the housing 220, and may be disposed while avoiding the PCB 260. According to various embodiments, the rechargeable battery 270 and the PCB 260 may be disposed parallel to each other without overlapping each other. However, without being limited thereto, at least a portion of the rechargeable battery 270 may be disposed to overlap the PCB 260.

In an embodiment of the disclosure according to various embodiments, the housing 220 is used alone, but at least one plate (e.g., an intermediate plate, a rear plate, or a detachable battery cover), which is coupled to the housing 220 alone, may be used together with the housing 220. According to various embodiments, the housing 220 may be formed using a conductive member (e.g., a metal member) and a non-conductive member (e.g., a resin) together. According to various embodiments, the housing 220 may be formed using a conductive or non-conductive member through an insert injection process or a dual injection process.

According to various embodiments, the display 201 may be assembled with the housing 220 after the display module 2012 is attached to the rear face of the window 2011. According to various embodiments, the window 2011 may be formed of a transparent material such as glass or resin. According to various embodiments, the display 201 may include a touch sensor (not illustrated). For example, the touch sensor may be interposed between the window 2011 and the display module 2012, or may be disposed inside the display module 2012. According to various embodiments, the display 201 may include a touch sensor and a pressure sensor. For example, the touch sensor may be interposed between the window 2011 and the display module 2012 or may be disposed inside the display module 2012, and the pressure sensor may be disposed on the rear face of the display module 2012. According to various embodiments, the electronic device 200 may include at least one seal member 250 interposed between the housing 220 and the display 201 and disposed for a waterproofing purpose.

According to various embodiments, the electronic device 200 may include a seal member 290 interposed between the rear face of the housing 220 and the rear window 211 along the rim thereof for a waterproofing purpose. According to various embodiments, the rear window 211 may be formed of at least one of glass, plastic, composite resin, and metal. According to various embodiments, the seal members 250 and 290 may include at least one of tape, adhesive, waterproof dispensing, silicon, waterproof rubber, and urethane.

According to various embodiments, the PCB 260 may include a memory, a processor, various sensors, input/output terminals, etc., and may enable the electronic device to perform various functions using power supplied from the rechargeable battery 270. According to various embodiments, the PCB 260 may be disposed to be in close proximity to the rechargeable battery 270. According to various embodiments, the PCB 260 may be disposed such that one face thereof is in contact with one face of the rechargeable battery 270 to overlap at least a portion of the battery 270, or may be configured in a "L" or "U" shape avoiding the space for disposing the rechargeable battery 270 such that the PCB 260 divisionally occupies the same plane together with the rechargeable battery 270.

According to various embodiments, the rechargeable battery 270 may supply power to major components such as the display 201 and the PCB 260, and may provide a seat plane for the wireless power transmission/reception member 280, various sheet-type sensors, or the like. The rechargeable battery 270 may be disposed in a battery pack mounting region where a predetermined space is ensured by a seat cavity space or a guide rib provided in a portion of the housing 220 for stable assembly and preventing movement during use due to the volume and weight thereof. According to various embodiments, the rechargeable battery 270 may be used as a built-in battery embedded in the electronic device 200 or may be separated from the electronic device by the user for the purpose of exchange from the electronic device as the battery cover is opened.

According to various embodiments, the rechargeable battery 270 may include a battery pouch in which a battery cell is contained, a protective circuit module (PCM) (e.g., a circuit board) to which terminals drawn out from the battery pouch are electrically connected, and case (e.g., a PCM housing or a PCM case) for protecting the PCM. According to the various embodiments, the case accommodating the PCM may be fixed to the battery pouch as an assembly structure for improving the impact resistance, thereby preventing the components of rechargeable battery (e.g., the battery pouch, the PCM, or the terminals) from being damaged even if an external impact is applied to the electronic device.

Figure 3A:
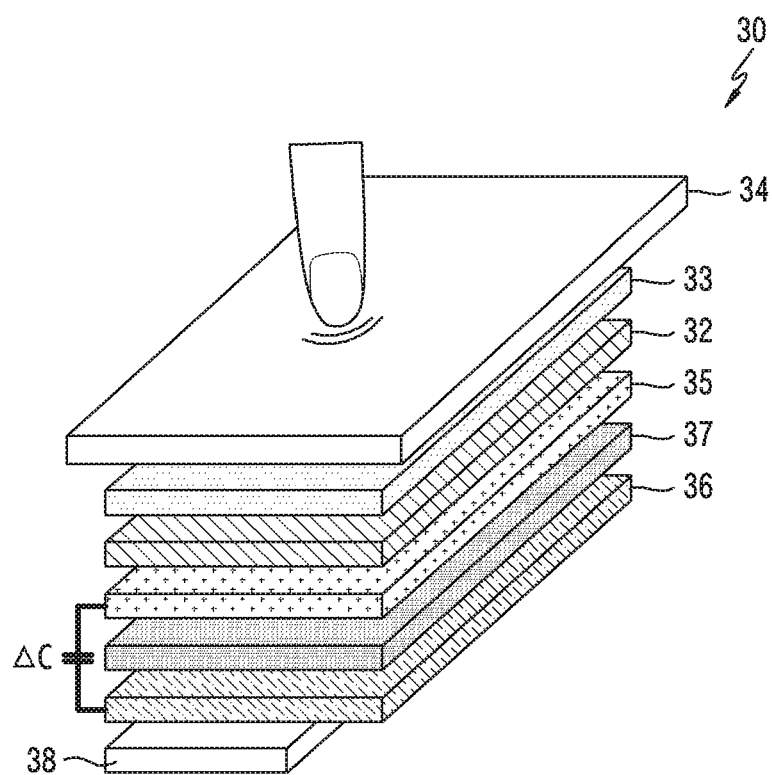
FIG. 3A is a perspective view of an electronic device including an electrostatic pressure sensor according to various embodiments of the disclosure.
Figure 3B:
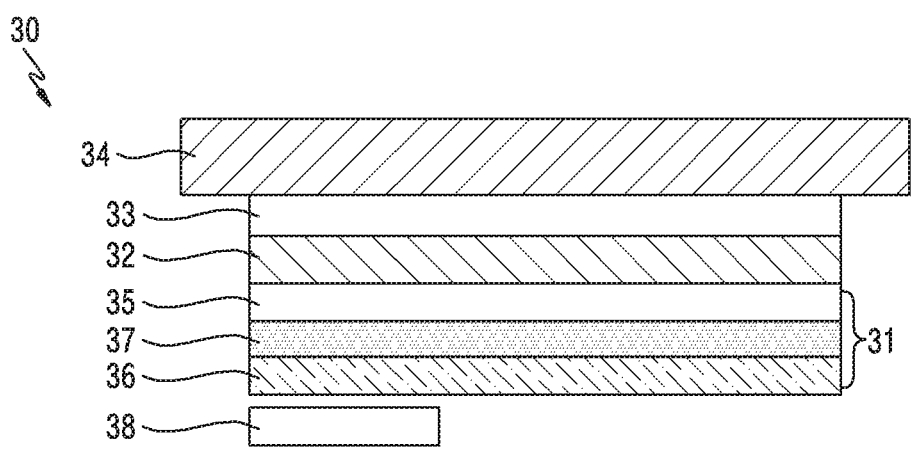
FIG. 3B is a cross-sectional view of an electronic device including an electrostatic pressure sensor according to various embodiments of the disclosure.

FIG. 3A is a perspective view of an electronic device including an electrostatic pressure sensor according to an embodiment of the disclosure. FIG. 3B is a cross-sectional view of the electronic device including the electrostatic pressure sensor according to an embodiment of the disclosure.

Referring to FIGS. 3A and 3B, according to various embodiments, an electronic device 30 may include a cover window 34, a touch sensor 33, a display 32, a pressure sensor 31, and a haptic actuator 38.

According to various embodiments, the display 42 may include a touch sensor 33 disposed on a first face to face in a first direction, a pressure sensor disposed on a second face to face in a second direction opposite the first direction, and a cover window 34 disposed on a face of the touch sensor 33, which faces in the first direction. The cover window 34 may be a cover window.

For example, the cover window 34 may be a protective member serving as a transparent cover or a transparent window, and may be made of a material excellent in light transmittance, heat resistance, chemical resistance, mechanical strength, etc. The cover window 34 may be, for example, a transparent film made of polymer or the like or a glass substrate.

For example, the cover window 34 may include any one material or a combination of two or more materials selected from a group consisting of acrylonitrile butadiene styrene (ABS), acrylic, polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (DCPD), cyclopentadiene anions (CPD), polyarylate (PAR), polyethersulfone (PES), polyether imide (PEI), a modified epoxy resin, and an acrylic resin. Alternatively, the cover window 34 may be formed of a variety of high hardness films. When the cover window 34 is formed of a high hardness film, a hard coating may be applied to a surface treatment portion.

According to various embodiments, the pressure sensor 31 may include a first electrode 35, a second electrode 36, and a dielectric layer 37 interposed between the first and second electrodes 35 and 36. The pressure sensor 31 is able to sense the capacitance value according to a distance change between the first electrode 35 and the second electrode 36, and to output the sensed value to the processor. The dielectric layer 37 may be made of a material whose thickness changes depending on an external pressure applied thereto. For example, the dielectric layer 37 may have elasticity and restoration force. Thus, the dielectric layer 37 may vary in thickness depending on the input of an external object.

For example, the pressure sensor 31 may be disposed below the display 32 as illustrated. In such a case, the first electrode 35 or the second electrode 36 may be disposed integrally with the display 32 (FPCB) or may be disposed on a separate support member (FPCB). Alternatively, unlike that illustrated in the drawing, the pressure sensor 31 may be interposed between the cover window 34 and the display 32. In such a case, the first electrode 35 or the second electrode 36 may be disposed integrally with the touch sensor 33, or may be disposed on a separate support member (PET). Alternatively, unlike that illustrated in the drawing, at least a portion of the pressure sensor 31 (at least one electrode layer) may be disposed inside the display 32. In this case, the first electrode 35 or the second electrode 36 may be interposed between the electrodes of display 32.

According to various embodiments, the dielectric layer 37 may include any one material or a combination of two or more materials selected from a group consisting of silicon, air, a membrane, double-sided adhesive film, pressure sensitive adhesive (PSA), optically clear adhesive (OCA), optical clear resin (OCR), sponge, rubber, ink, ABS, acrylic, PC, PMMA, PI, PET, PPT, APET, PEN, PETG, TAC, COP, COC, DCPD, CPD, PAR, PES, PEI, a modified epoxy resin, and an acrylic resin.

For example, a transparent electrode of the pressure sensor 31 may include indium tin oxide (ITO), indium zinc oxide (IZO), Poly(3,4-ethylenedioxythiophene) (PEDOT), Ag nanowire, a metal mesh, a transparent polymer conductor, graphene, or the like. An opaque electrode of the pressure sensor may include Ag, Cu, Mg, Ti, Al, Graphene, or the like.

The haptic actuator 38 may be disposed at a position, which is spaced apart from the display 32. The haptic actuator 38 may generate a vibration or haptic effect according to the pressure of an external object. The haptic actuator 38 may generate vibration or haptic effect with different intensity depending on the magnitude of the pressure. For example, the haptic actuator 38 may generate vibration or haptic effect, the intensity of which increases as the pressure of the external object increases.

According to various embodiments, the pressure sensor 31 may be configured as any one of an electrostatic-type, an induction-type, a strain-gauge-type, and a piezo-type depending on the operation method thereof, and will be described with reference to FIGS. 4, 5, 6, 7A, and 7B. In addition, according to various embodiments, the pressure sensor 31 may be implemented as a self-capacitance-type or a mutual-capacitance-type, which will be described with reference to FIGS. 8 and 9.

Although the touch sensor according to various embodiments is illustrated as being interposed between the cover window and the display, at least a portion of the touch sensor (at least one electrode layer) may be disposed inside the display.

Although the haptic actuator according to various embodiments is illustrated as if one haptic actuator is disposed under the pressure sensor, the haptic actuator may be arranged at various positions of the electronic device and a plurality of haptic actuators may be provided. The haptic actuator may provide various types of vibration feedback to the while or a portion of the electronic device.

According to various embodiments, the display may include various displays such as an organic light emitting diode (OLED), a liquid crystal display (LED), and a quantum dot (QD).

Figure 4:
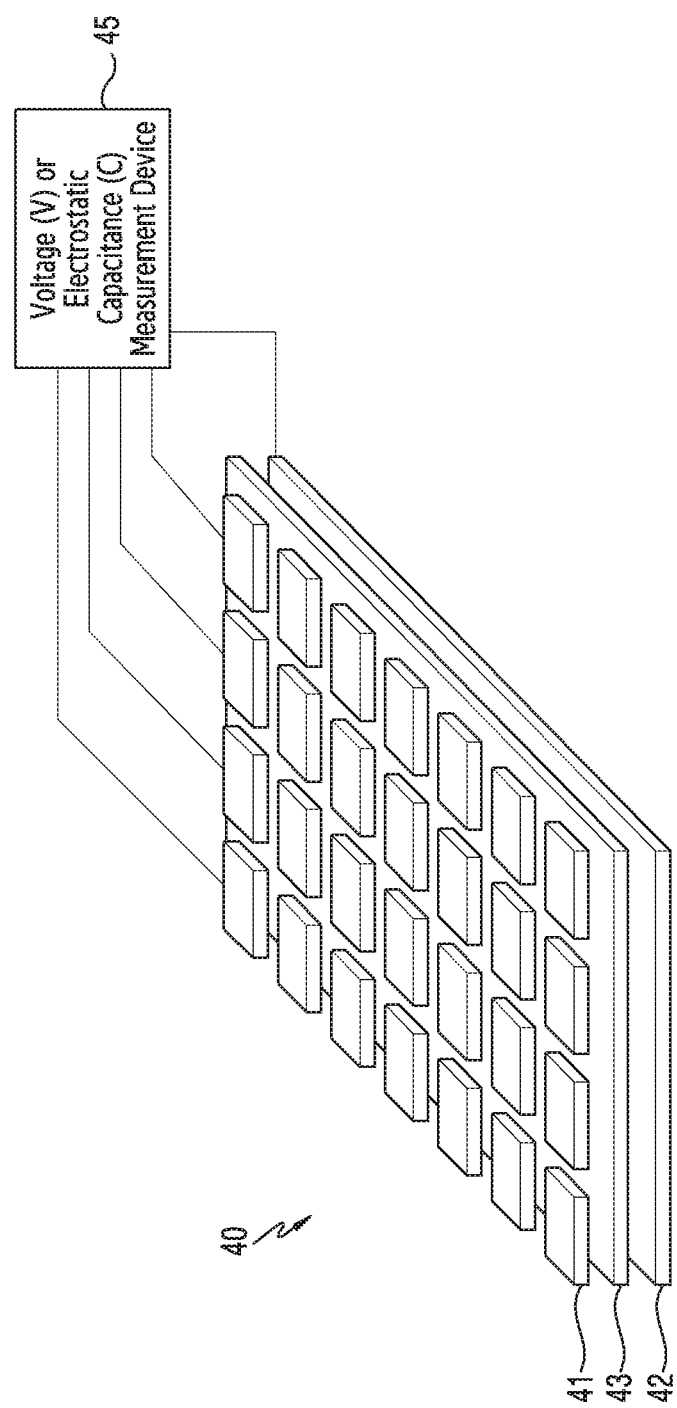
FIG. 4 is a perspective view illustrating an electrostatic-type pressure sensor according to various embodiments of the disclosure.

FIG. 4 is a perspective view illustrating an electrostatic-type pressure sensor according to various embodiments of the disclosure.

Referring to FIG. 4, a capacitive pressure sensor 40 according to various embodiments is able to sense pressure on the basis of a change of the capacitance (measured by a voltage or electrostatic capacitance measurement device 45) formed in dielectric layer 43 interposed between two electrodes 41 and 42 depending on a pressure applied by the user. The capacitance may increase as the distance between the two electrodes 41 and 42 is reduced due to the pressure applied by the user. The positions or shapes of the first electrode 41 and the second electrode 42 may be mutually changed.

Figure 5:
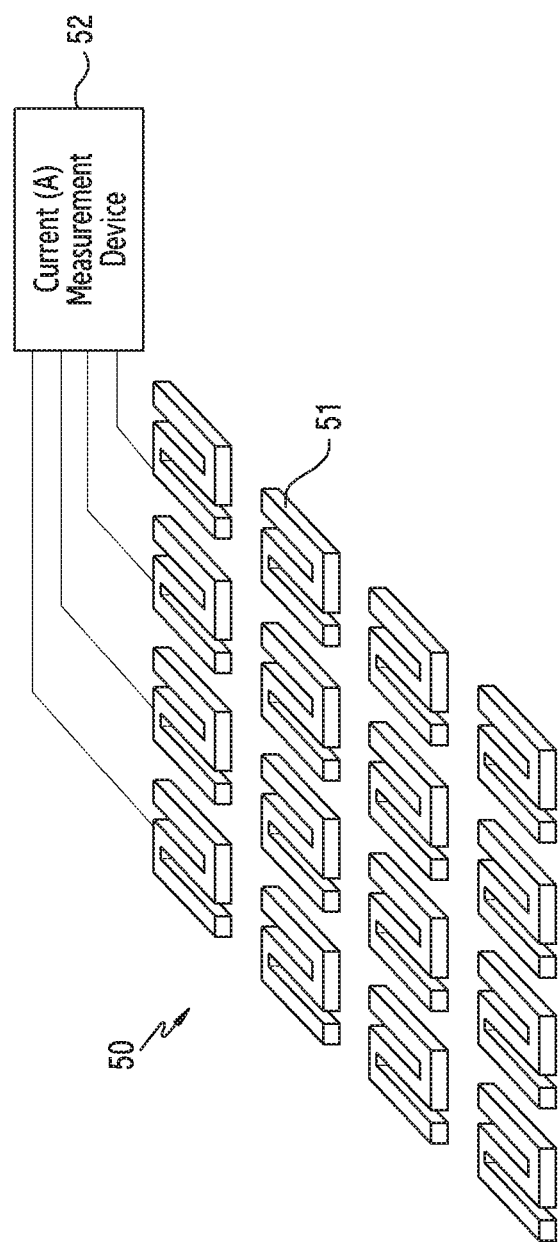
FIG. 5 is a perspective view illustrating an induction-type pressure sensor according to various embodiments of the disclosure.

FIG. 5 is a perspective view illustrating an induction-type pressure sensor according to various embodiments of the disclosure.

Referring to FIG. 5, an induction-type pressure sensor 50 according to various embodiments is able to sense a pressure on the basis of a change in current (measured by the current measurement device 52) induced in an inductor 51 (e.g., a coil) according to a pressure applied by the user. The current may increase as the conductors (e.g., a metal housing or the user's fingers) approach the inductor 51 (e.g., a coil) disposed within the housing by the pressure applied by the user.

Figure 6:
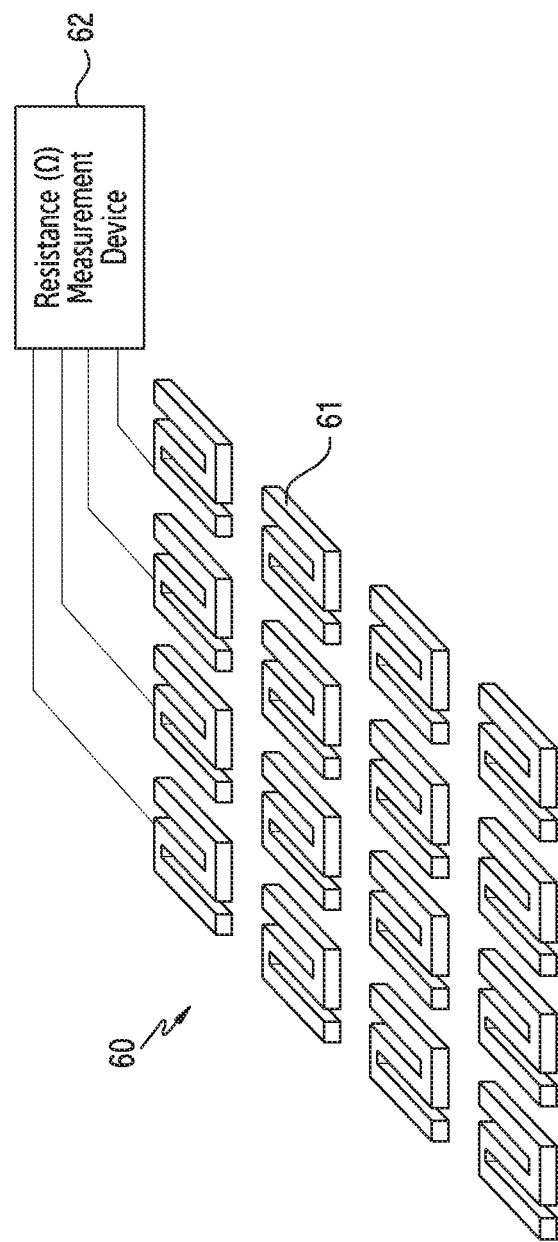
FIG. 6 is a perspective view illustrating a strain-gauge-type pressure sensor according to various embodiments of the disclosure.

FIG. 6 is a perspective view illustrating a strain-gauge-type pressure sensor according to various embodiments of the disclosure.

Referring to FIG. 6, a strain-gauge-type pressure sensor 60 according to various embodiments is able to sense a pressure on the basis of a change in resistance (measured by a resistance measurement device 62) of a wiring 61 (a conductor) according to a pressure applied by the user. The resistance is able to increase as the cross-sectional area of the wiring 61 decreases as the length of the wiring 61 increases by the pressure applied by the user. The wiring 61 may be configured in the form of a Wheatstone bridge.

Figure 7A:
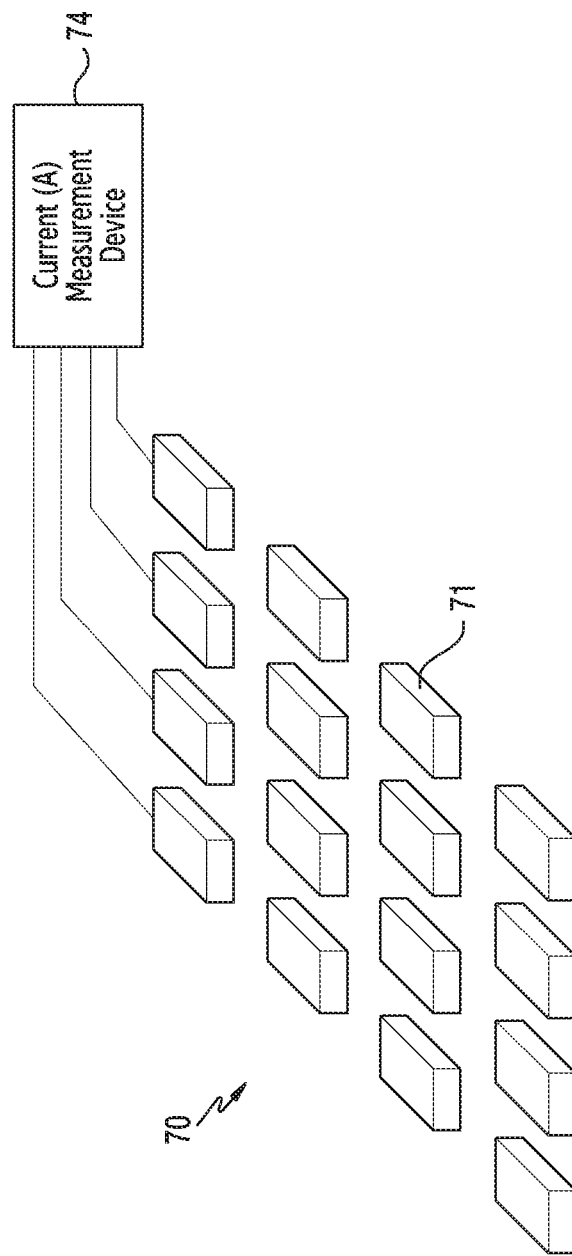
FIGS. 7A and 7B are perspective views illustrating a piezo-type pressure sensor according to various embodiments of the disclosure.
Figure 7B:
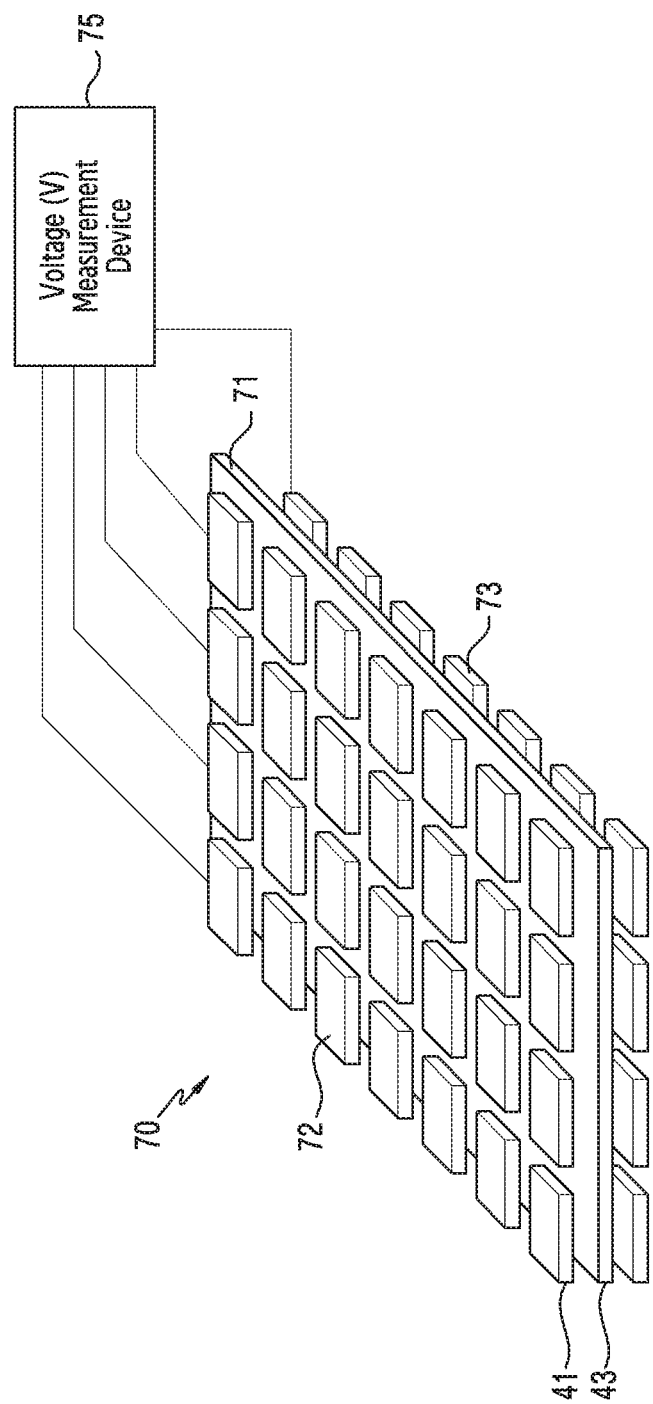

FIGS. 7A and 7B are perspective views each illustrating a piezo-type pressure sensor according to various embodiments of the disclosure.

Referring to FIGS. 7A and 7B, a piezo-type pressure sensor 70 according to various embodiments is able to sense a pressure on the basis of a current difference (measured by the current measurement device 74) generated by the piezo material 71 according to a pressure applied by the user. According to various embodiments, the piezo-type pressure sensor 70 is able to sense a pressure on the basis of a voltage difference (measured by the voltage measurement device 75) between the first and second electrodes 72 and 73, which is generated by the piezo material 71 according to the pressure applied by the user.

The current or voltage difference may increase as the amount of current converted by the piezo material 71 increases according to the pressure applied by the user.

Figure 8:
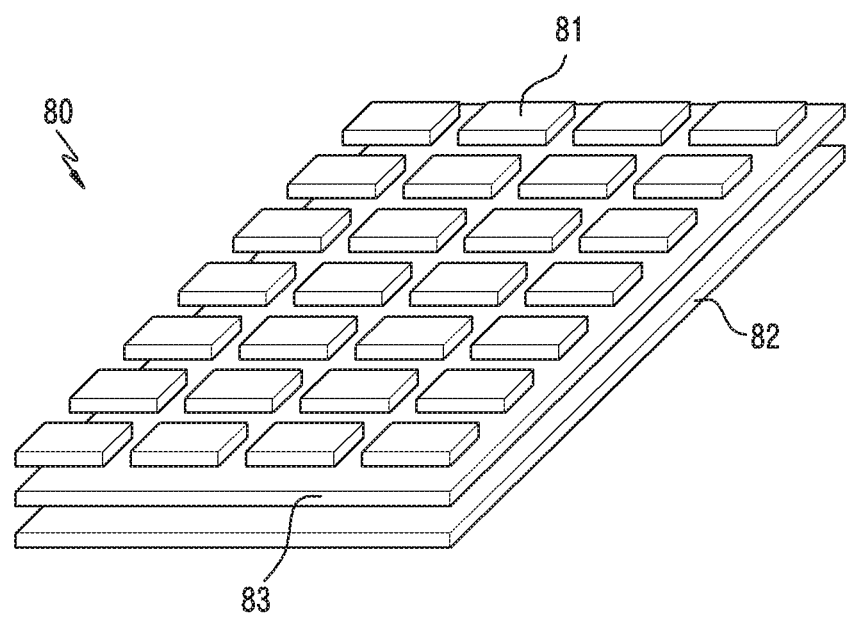
FIG. 8 is a perspective view illustrating a self-capacitance-type pressure sensor according to various embodiments of the disclosure.

FIG. 8 is a perspective view of a self-capacitance-type pressure sensor 80 according to an embodiment of the disclosure.

Referring to FIG. 8, a self-capacitance-type pressure sensor 80 of according to various embodiments may include first electrodes 81 in the form of a plurality of repeated polygons (or circles), a second electrode 82 extending as one over the entire area corresponding to the polygons, and a dielectric layer 83 interposed between the first electrode 81 and the second electrode 82. The pressure sensor 80 may sense a pressure on the basis of a change in capacitance between each of partial electrodes of the first electrodes 81 and the second electrode 82. The positions or shapes of the first electrode 81 and the second electrode 82 may be mutually changed.

Figure 9:
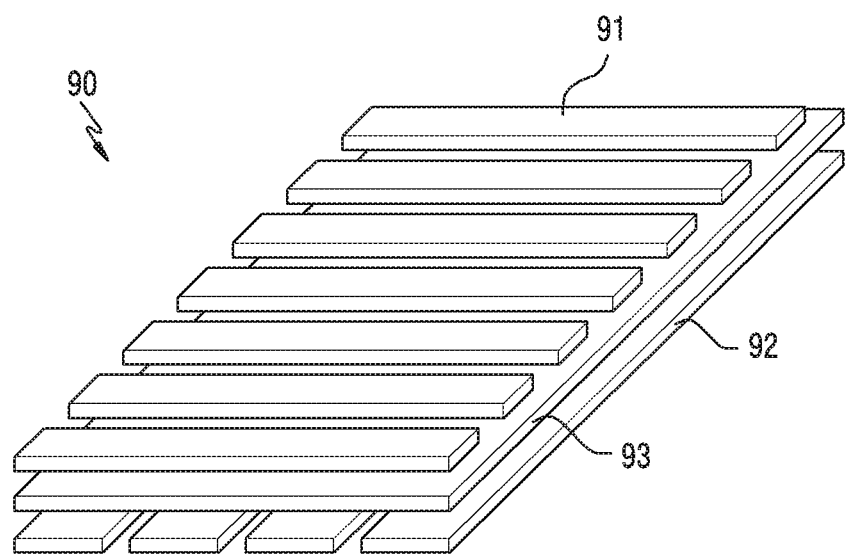
FIG. 9 is a perspective view illustrating a mutual-capacitance-type pressure sensor according to various embodiments of the disclosure.

FIG. 9 is a perspective view of a mutual-capacitance-type pressure sensor according to an embodiment of the disclosure.

Referring to FIG. 9, a mutual-capacitance-type pressure sensor 90 according to various embodiments may include a first electrode 91 extending in a first direction, a second electrode 92 extending in a second direction substantially perpendicular to the first direction, and a dielectric layer 93 interposed between the first electrode 91 and the second electrode 92. The pressure sensor 90 is able to sense a pressure on the basis of a capacitance difference between the first electrode 91 and the second electrode 92 at a point where the first electrode 91 and the second electrode 92 intersect each other. The positions or shapes of the first electrode 91 and the second electrode 92 may be mutually changed.

According to various embodiments, the first electrode 91 or the second electrode 92 may be opaque or transparent. That is, when the user looks at the pressure sensor 90, an object disposed opposite the pressure sensor 90 may not be visible (opaque) or visible (transparent).

When the first electrode 91 or the second electrode 92 according to various embodiments is opaque, the first electrode 91 or the second electrode 92 may include at least one material or a combination of two or more materials selected from Cu, Ag, Mg, and Ti. When the first electrode 91 or the second electrode 92 is transparent, the first electrode 91 or the second electrode 92 may be include at least one material or a combination of two or more materials selected from ITO, IZO, a polymeric conductor, graphene, an opaque wiring pattern (Ag nanowire, a metal mesh, or the like).

According to various embodiments, the dielectric layer 93 may include at least one of silicon, air, foam, membrane, OCA, sponge, rubber, ink, and polymer (PC, PET, etc.).

Figure 10:
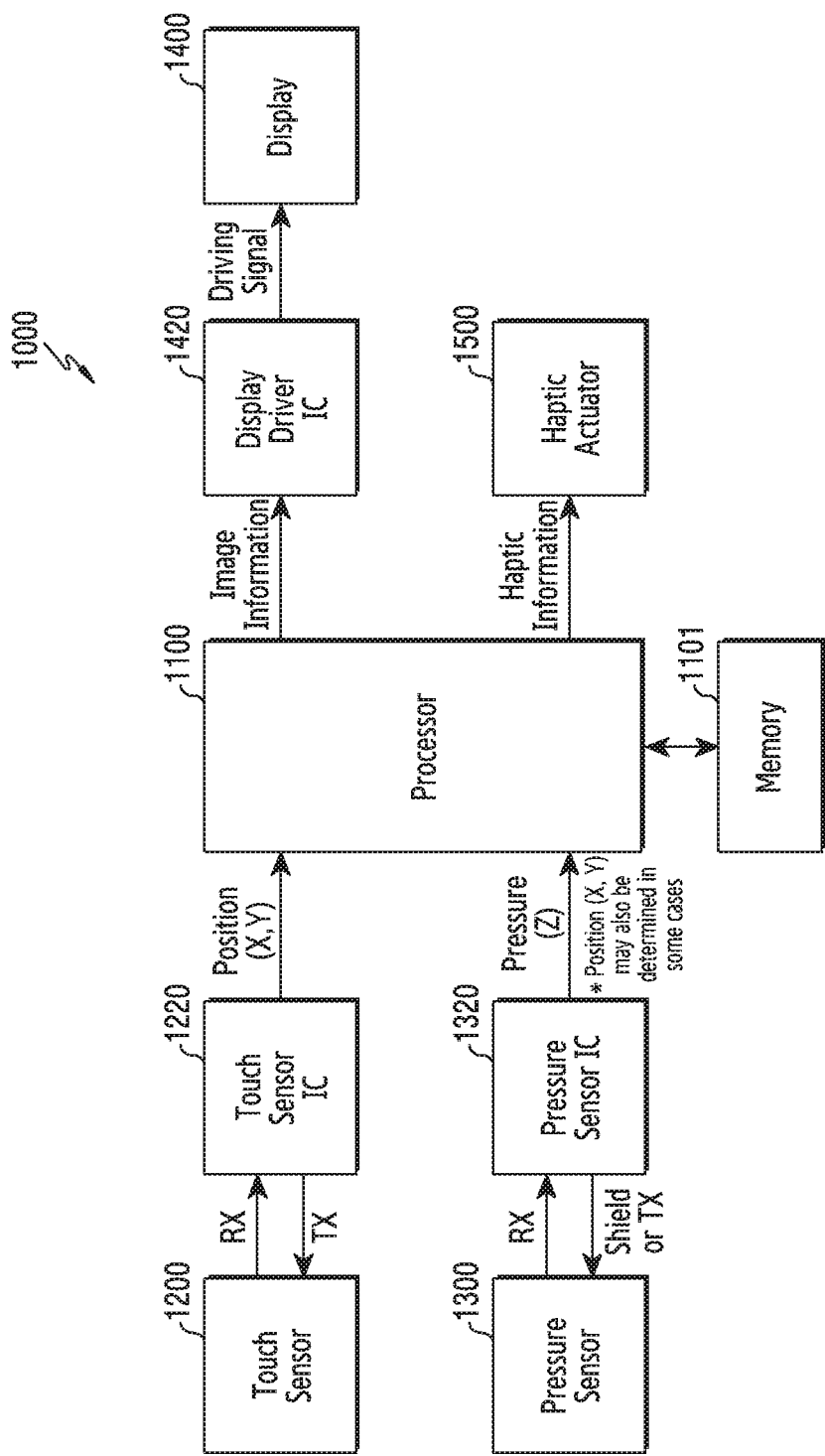
FIG. 10 is a block diagram illustrating a relationship between components included in an electronic device according to various embodiments of the disclosure.

FIG. 10 is a block diagram illustrating a relationship between components included in an electronic device according to an embodiment of the disclosure.

Referring to FIG. 10, an electronic device 1000 according to various embodiments may include a processor 1100, a memory 1101, a touch sensor 1200, a touch sensor integrated circuit (IC) 1220, a pressure sensor 1300, a pressure sensor IC 1326, a display 1400, a display driver integrated circuit (DDIC) 1426, or a haptic actuator 1500.

According to various embodiments, the touch sensor IC 1220 is able to transmit/receive a signal (a transmission signal TX, a reception signal RX, a stimulus signal, or the like) to/from the touch sensor 1200. The touch sensor IC 1220 is able to sense a touch input position of the user on the basis of a signal transmitted to or received from the touch sensor 1200. The touch sensor IC 1220 is able to transmit the sensed touch input position to the processor 1100. The touch sensor IC 1220 is able to transmit/receive a signal to/from the touch sensor 1200 only in the touchable region defined by the processor 1100, for example. Alternatively, even if the touch sensor IC 1220 transmits/receives a signal to/from the touch sensor 1200 with respect to the entire region, when a touch input position is located within the touchable region, the touch sensor IC 1220 transmits a touch input position to the processor 1100, and when the touch input position is located outside the touchable region, the processor 1100 may not transmit the touch input position to the processor 1100. The touch sensor IC 1220 may operate in a normal mode and/or a low power mode. In the low power mode, the touch sensor IC 1220 may operate with a touch sensing frequency and/or a touch scan period lower than those in the normal mode.

According to various embodiments, the pressure sensor IC 1320 is able to transmit/receive a signal (a transmission signal TX, a reception signal RX, a stimulus signal, or the like) to/from the pressure sensor 1300. The pressure sensor IC 1320 may transmit the intensity (pressure) and/or a pressure retention time of the sensed touch input to the processor 1100. The processor 1100 or the pressure sensor IC 1320 may determine the intensity (pressure) and/or the pressure retention time of the user's touch input on the basis of the signal received from the pressure sensor 1300.

According to various embodiments, the pressure sensor IC 1320 is able to transmit/receive a signal to/from the pressure sensor 1300 only in the touchable region defined by the processor 1100, for example. Alternatively, even if the pressure sensor IC 1320 transmits/receives a signal to/from the pressure sensor 1300 with respect to the entire region, when a pressure position is located within the pressure-applicable region, the pressure sensor IC 1320 transmits a pressure position to the processor 1100, and when the touch input position is located outside the pressure-applicable region, the processor 1100 may not transmit the pressure position to the processor 1100. The pressure sensor IC 1320 may operate in a normal mode and/or a low power mode. In the low power mode, the pressure sensor IC 1320 may operate with a pressure sensing frequency and/or a pressure scan period lower than those in the normal mode.

According to various embodiments, the processor 1100 is able to set a user-inputtable region (a touchable area, a pressure-applicable region, or the like) that can be recognized by the touch sensor IC 1220 and/or the pressure sensor IC 1320, and to transmit the set inputtable region to the touch sensor IC 1220 and/or the pressure sensor IC 1320. The position of the user-inputtable region is changeable. In this case, the processor 1100 may transmit the changed position of the user-inputtable region to the touch sensor IC 1220 and/or the pressure sensor IC 1320.

According to various embodiments, the processor 1100 may determine image information to be transmitted to the DDIC 1420, the position of the image information, and/or haptic information to be transmitted to the haptic actuator 1500. For example, when the intensity of the received touch input is equal to or greater than a first threshold, the processor 1100 may transmit the first image information to the DDIC 1420 and may transmit the first haptic information to the haptic actuator 1500. For example, when the intensity of the received touch input is equal to or greater than a second threshold value, which is greater than the first threshold value, the processor 1100 may transmit second image information (e.g., image information obtained by enlarging at least a portion of the first image information) to DDIC 1420 and may transmit second haptic information (e.g., haptic information stronger than the first haptic information) to the haptic actuator 1500. The processor 1100 is able to synchronize, for example, the first position and the first intensity of the touch input received at the first time, and to synchronize the second position and the second intensity of the touch input received at the second time, which is different from the first time.

According to various embodiments, the processor 1100 may transfer the information to each module and may then be switched to a deactivated state. The processor 1100 may be in a deactivated state in an always on display (AOD) mode. When the processor 1100 is inactivated in the AOD mode and is then activated when transmitting the image information and/or control information to the DDIC 1420, the touch sensor IC 1220, the pressure sensor IC 1320, etc., the process may be activated to transfer the information and may then be switched to the deactivated state again.

According to various embodiments, the DDIC 1420 may transmit a driving signal (e.g., a driver driving signal, or a gate driving signal) to the display on the basis of the image information received from the processor 1100.

According to various embodiments, the memory 1101 may store instructions or data that cause the processor 1100 to perform the operations and may include volatile or nonvolatile memory.

Hereinafter, an electronic device according to various embodiments of the disclosure will be described with reference to the accompanying drawings.

FIGS. 11, 12, 13, 14, 15, and 16 are cross-sectional views each illustrating an electronic device in which a display and sensors are disposed according to various embodiments of the disclosure.

Figure 11:
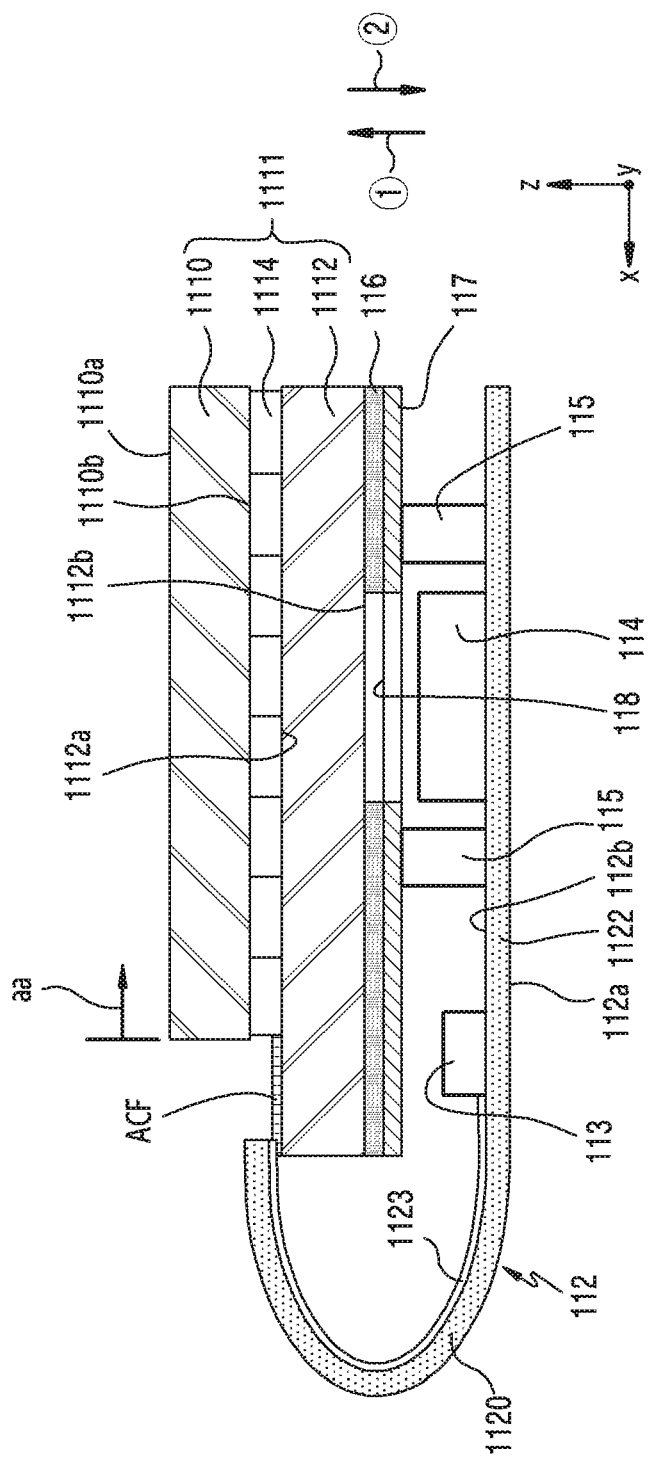

Referring to FIG. 11, an electronic device according to various embodiments of the disclosure may be configured at least partially to be the same as the electronic device 100 illustrated in FIGS. 1A and 1B. According to various embodiments, the electronic device may include a display 1111, a flexible layer 112, a DDIC 113, and a PCB (see FIG. 10).

According to various embodiments, the display 111 may be made of a rigid material or a flexible material. For example, the display 111 may be configured in a flat shape, a curved shape, a rollable shape, a foldable shape, or a combination thereof. In the case of a display configured in the combination, a curved shape may be formed in an edge area of the flat region in the display. As will be described below, when the display includes a touch sensitive panel, it may be referred to as a touch screen display.

When the display 111 according to various embodiments is configured with an OLED, the display 111 may include a first glass plate 1110, a second glass plate 1112, and an OLED layer 1114 interposed between the first and second glass plates 1110 and 1112. The glass plate may be referred to as a glass cover, a glass member, or a glass material portion. For example, when the display 111 according to various embodiments is configured with a flexible OLED, the display 111 may include a first transparent film, a second transparent film, and an OLED interposed between the first and second transparent films.

The first glass plate 1110 according to various embodiments may include a first face 1110a facing in a first direction and a second face 1110b facing in a second direction opposite the first direction. When the first direction is the upward direction, the first face 1110a of the first glass plate 1110 is a first top face, and when the second direction is the downward direction, the second face 1110b may be referred to as a first bottom face. In addition, the first glass plate 1110 may be referred to as an upper glass plate, and the second glass plate 1112 may be referred to as a lower glass plate.

The second glass plate 1112 according to various embodiments may include a first face 1112a facing in the first direction and a second face 1112b facing in the second direction opposite the first direction. When the first direction is the upward direction, the first face 1112a is a first top face, and when the second direction is the downward direction, the second face 1112b may be referred to as a first bottom face. The first face 1112a of the second glass plate is the face that is directed to the second face 1110b of the first glass plate, and the second face 1112b of the second glass plate may be the face that is directed to the second portion 1122 of the flexible layer 112.

The OLED layer 1114 according to various embodiments may be interposed between the second face 1110b of the first glass plate and the first face 1112a of the second glass plate.

The flexible layer 112 (chip-on-film (COF)) according to various embodiments is a connecting member for transmitting an electrical signal, and includes a film or a FPCB having a wiring. The flexible layer 112 may be curved, bendable, or foldable. The flexible layer 112 according to various embodiments is a member of a flexible material that electrically connects the display 111 to the DDIC 113. The flexible layer 112 may include, for example, a first portion 1126 bent around an edge and a flat second portion 1122. For example, one end of the flexible layer 112 may be connected to an edge of the second face 1112b of the second glass plate by an anisotropic conductive film (ACF). The flexible layer 112 may include a first portion 1120 that initiates from an edge of the second face 1112b of the second glass plate and is bent toward the second plate of the housing (see FIG. 21) and a second portion 1122 extending from the first portion 1120 in a horizontal direction. For example, the first portion 1120 may be bent at least once and the second portion 1122 may be disposed substantially horizontally so as to include a flat face.

The flexible layer 112 according to various embodiments may include a first face 112a facing in the first direction and a second face 112b facing in the second direction opposite the first direction. The flexible layer 112 may be provided with a DDIC 113, a pressure sensor 115, and a fingerprint sensor 114 to be described later on the second face 112b. The flexible display 112 may be bent 180 degrees in the first portion 1120 such that the second face 112b may be located at the upper side and the first face 112a may be located at the lower side. Accordingly, the DDIC 113, the pressure sensor 115, and the fingerprint sensor 114 disposed on the second face 112b may be interposed between the second glass plate 1112 and the second plate of the housing (See FIG. 21).

The DDIC 113 according to various embodiments is a chip necessary to drive a plurality of pixels constituting the display 111 and may be disposed on a second face 112b of the flexible layer. For example, the DDIC 113 may be disposed in the second portion 1122 of the flexible display and may be located between the second glass plate 1112 and the second plate (see FIG. 21). Further, the DDIC 113 may be interposed between the second face 112b of the second glass plate and the second portion 1122 of the flexible layer.

Since the disposed position of the DDIC 113 is disposed below the second glass plate 1112 in the edge region of the second face 1112b of the second glass plate, the black matrix (BM) region of the display may decrease and the active area may increase.

Reference numeral 116 denotes a dielectric layer made of a foamed polymer resin material such as black sponge. Reference numeral 117 denotes a copper sheet, which is disposed on the rear face of the display 111 and can serve as a heat dissipation plate that performs a heat dissipation function. Although not illustrated, a backing tape may be further provided on the bottom face of the copper sheet.

In the electronic device according to various embodiments, the fingerprint sensor 114 and the pressure sensor 115 may be disposed in the second portion 1122 in a region overlapping the active area aa of the display 111.

According to various embodiments, the fingerprint sensor 114 is mounted on the second face 112b of the second portion 1122 of the flexible layer and is interposed between the second glass plate 1112 and the second portion 1122. For example, the fingerprint sensor 114 may be positioned parallel to the display 41 in an overlapping manner. The dielectric layer 116 and the copper sheet 117 facing the top face of the fingerprint sensor 114 may be cut out so that an opening 118 corresponding to the shape of the top face of the finger printer sensor (e.g., a rectangular shape) may be disposed. The fingerprint sensor 114 is able to directly face the display 111 by the opening 118 and is optically operable. The above-mentioned optical operation may include a receiving operation performed by a light-reception unit and a transmitting operation performed by the light-transmission unit.

According to various embodiments, the pressure sensor 115 may be disposed adjacent to the fingerprint sensor 114 and may be disposed at a position that is independently spaced apart from the fingerprint sensor 44. The pressure sensor 115 may be mounted on the second face 112b of the second portion 1122 of the flexible layer and may be interposed between the second glass plate 1112 and the second portion 1122. For example, the pressure sensor 115 may be placed parallel with the display 111 in an overlapping manner and may be disposed in close contact with the copper sheet 117. Further, a plurality of pressure sensors 115 may be mounted.

The electronic device 1100 according to various embodiments may utilize a portion of the first face region of an edge of the second glass plate as an active area of the display by changing the disposed position of the DDIC 113 from the first face of the edge of the second glass plate to the second portion 1122 of the flexible layer.

Figure 12:
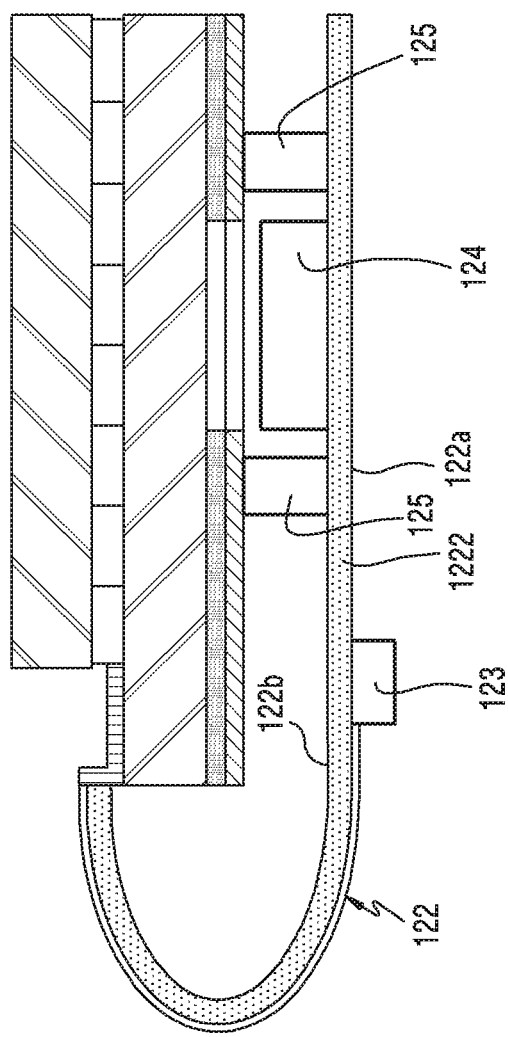

Referring to FIG. 12, the electronic device according to various embodiments of the disclosure is same as the electronic device 1100 illustrated in FIG. 11, except that the disposed positions of the DDICs 123 are different from each other. Therefore, a description of the same configuration will be omitted for avoiding redundant description.

In the electronic device according to various embodiments, the DDIC 123 may be disposed on the first face 122a of the flexible display while being mounted on the second portion 1222 of the flexible layer 122. The DDIC 123 may be located under the second portion 1222 of the flexible layer. In addition, the DDIC 123 may be mounted on the first face 122a different from the second face 122b on which the fingerprint sensor 124 and the pressure sensor 125 are mounted.

Figure 13:
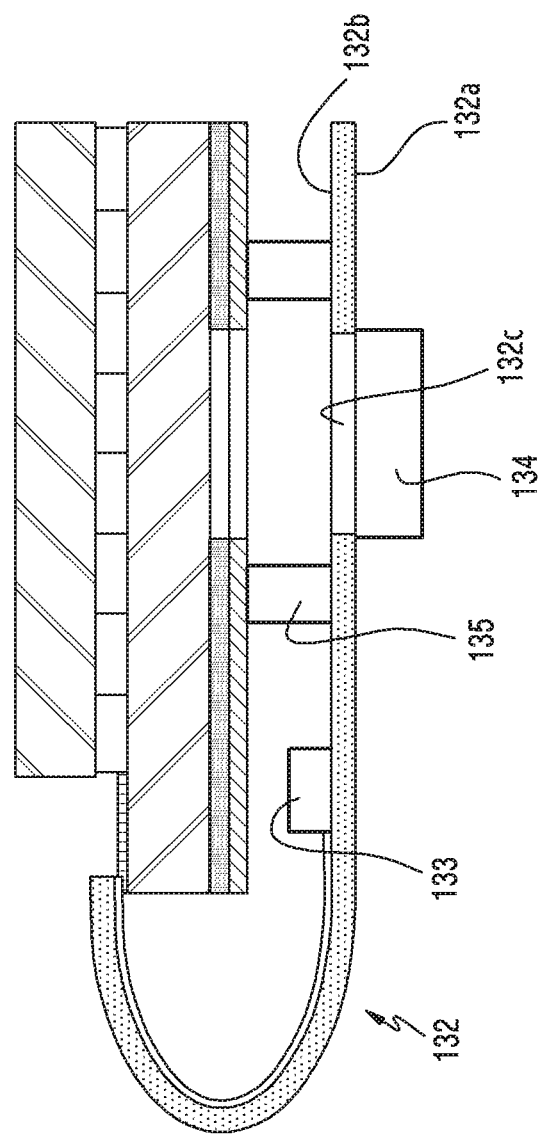

Referring to FIG. 13, the electronic device according to various embodiments is the same as the electronic device 1100 illustrated in FIG. 11, except that the disposed positions of the fingerprint sensors 134 are different from each other. Therefore, a description of the same configuration will be omitted for avoiding redundant description.

In the electronic device according to various embodiments, the fingerprint sensor 134 may be disposed on the first face 132a of the flexible display while being mounted on the second portion 1322 of the flexible layer 132. The fingerprint sensor 134 may be located under the second portion 1322 of the flexible layer. In addition, the fingerprint sensor 134 may be mounted on the first face 132a different from the second face 132b on which the DDIC 133 and the pressure sensor 135 are mounted.

In the flexible layer 132 according to various embodiments, the wiring is removed in the portion 132c where the fingerprint sensor 134 is disposed, so that only the transparent film material portion may be constituted. Such a structure may be constituted for the optical operation of the fingerprint sensor 134. For example, only the portion of the flexible layer 132 where the fingerprint sensor 134 is to be disposed may be removed so as to form an opening shape.

Figure 14:
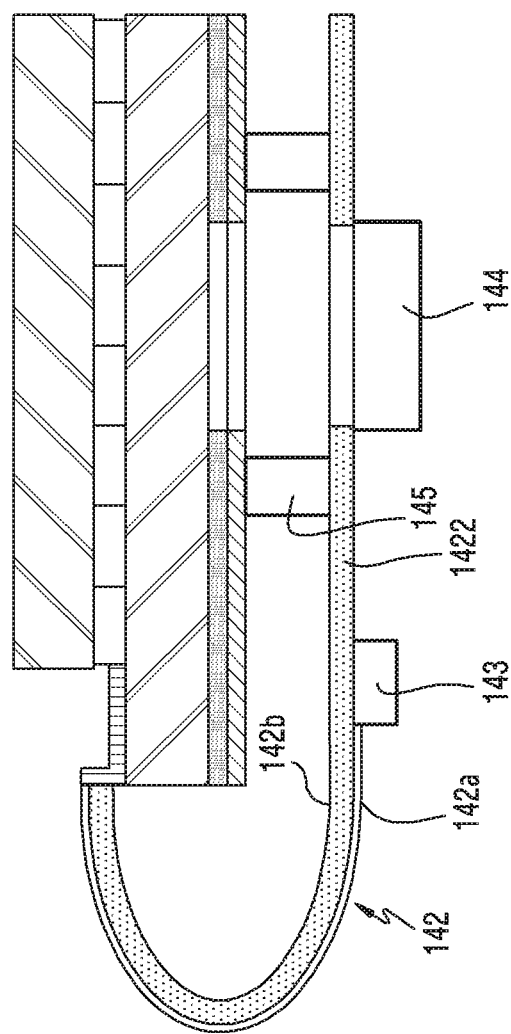

Referring to FIG. 14, the electronic device according to various embodiments of the disclosure is the same as the electronic device illustrated in FIG. 13, except that the disposed positions of the DDICs 143 are different from each other. Therefore, a description of the same configuration will be omitted for avoiding redundant description.

In the electronic device according to various embodiments, the DDIC 143 may be disposed on the first face 142a of the flexible display 142 while being mounted on the second portion 1422 of the flexible layer 142. The DDIC 143 may be located under the second portion 1422 of the flexible layer. In addition, the DDIC 143 may be mounted on the first face 142a different from the second face 142b on which the pressure sensor 145 is mounted, and may be disposed on the same first face 142a on which the fingerprint sensor 144 is mounted.

Figure 15:
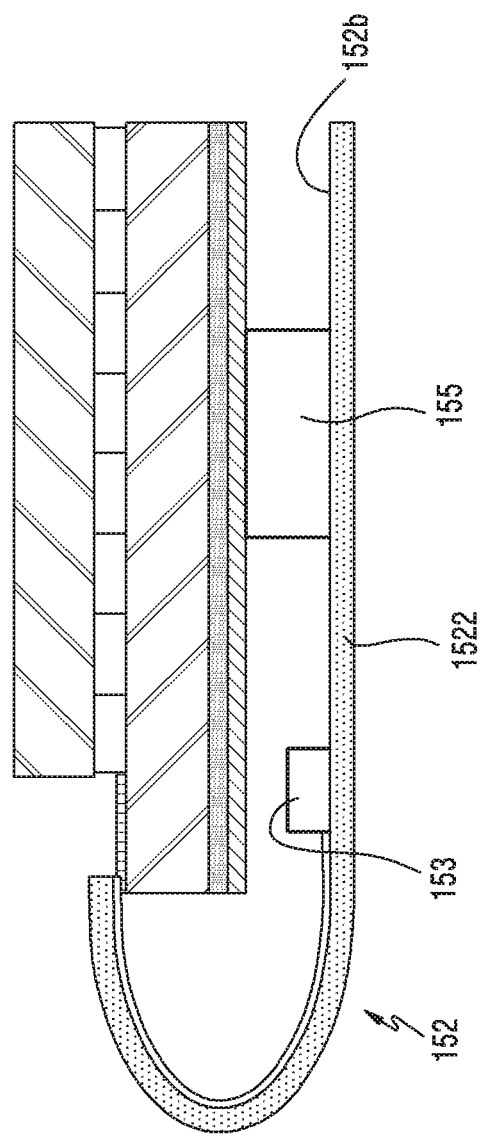

Referring to FIG. 15, the electronic device according to various embodiments of the disclosure is the same as the electronic device 1100 illustrated in FIG. 11, except that only the pressure sensor 155 is mounted on the second face 152b in the second portion 1522 of the flexible layer 152 while the fingerprint sensor is not mounted on the second face 152b in the second portion 152 of the flexible layer 152. Therefore, a description of the same configuration will be omitted for avoiding redundant description. The pressure sensor 155 may be disposed in close proximity to the DDIC 153.

Referring to FIG. 16, the electronic device 1600 according to various embodiments of the disclosure is the same as the electronic device illustrated in FIG. 15, except for the disposed position of the DDIC 163 in the second portion 1622 of the flexible layer 162. Therefore, a description of the same configuration will be omitted for avoiding redundant description. In the second portion 1622 of the flexible layer according to various embodiments, the DDIC 163 may be disposed on the first face 162a. The DDIC 163 may be disposed to face downward.

Figure 17A:
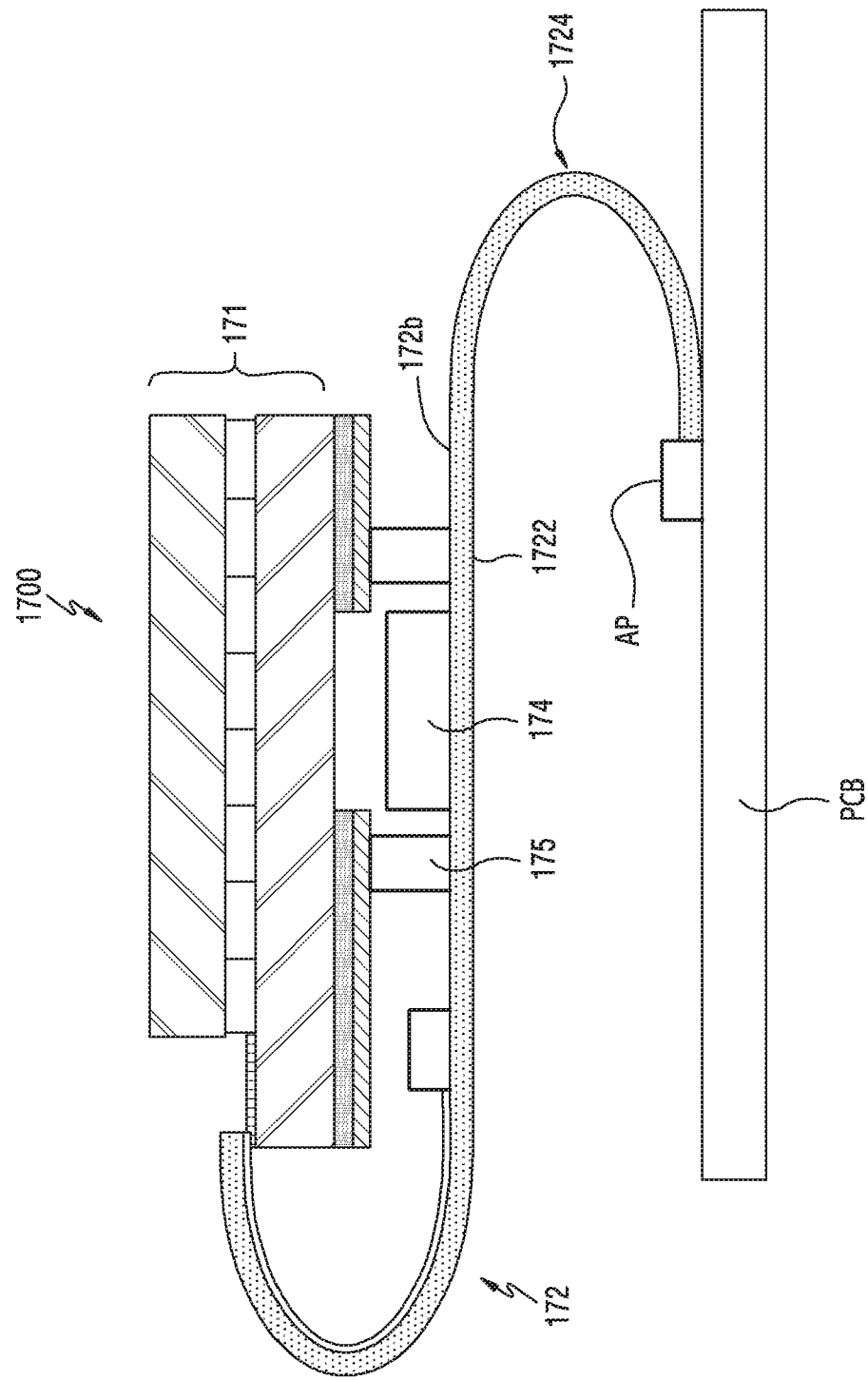
FIG. 17A is a cross-sectional view illustrating an electronic device in which a display and sensors are disposed according to various embodiments of the disclosure.

FIG. 17A is a cross-sectional view illustrating an electronic device in which a display and sensors are disposed according to various embodiments of the disclosure.

Referring to FIG. 17A, the electronic device 1700 according to various embodiments is the same as the electronic device 1100 illustrated in FIG. 11, except for an additional configuration in which a flexible layer 172 is electrically connected to the AP of the PCB directly, or electrically connected to the AP of the PCB via an auxiliary flexible layer 1724. Thus, a description of the same configuration will be omitted for avoiding redundant description. For example, the auxiliary flexible layer 1724 may include a film or a flexible circuit board with a wiring. For example, the auxiliary flexible layer 1724 may be formed integrally with the flexible layer 172, that is, as one flexible member.

Figure 17B:
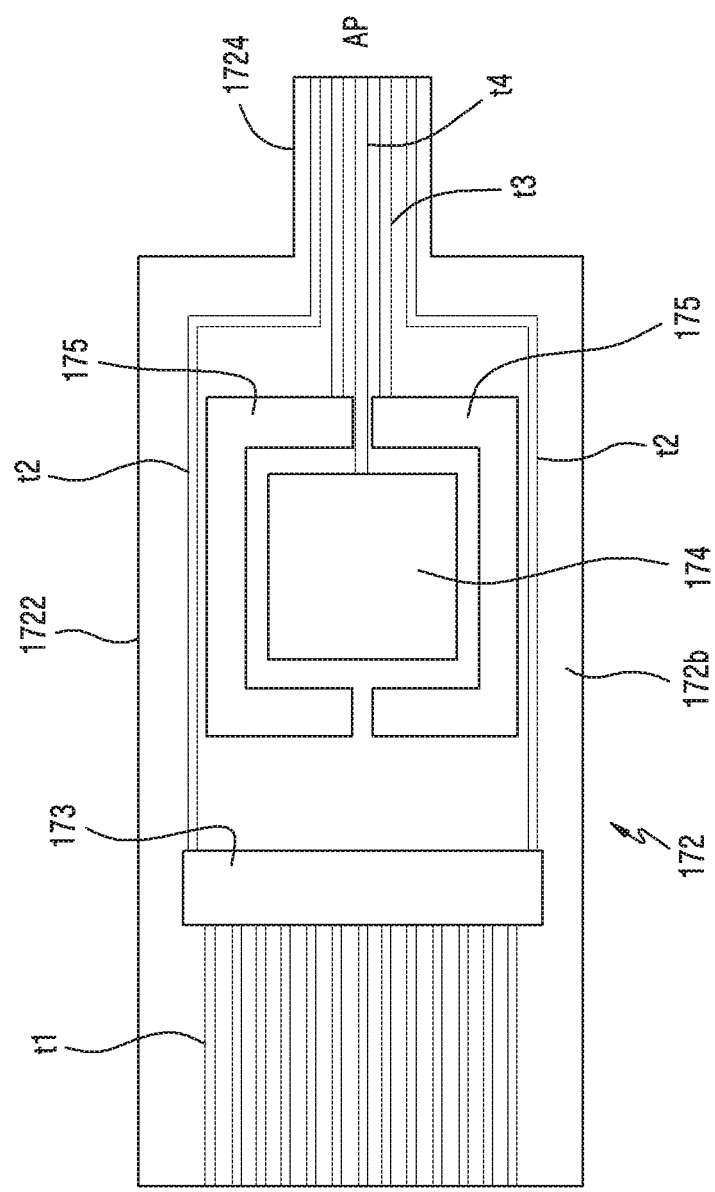
FIG. 17B is a plan view illustrating a display driver integrated circuit (DDIC) and sensors disposed on a flexible layer and a wiring (traces) thereof according to various embodiments of the disclosure.

FIG. 17B is a plan view illustrating a DDIC and sensors disposed on a flexible layer according to various embodiments and a wiring (traces) thereof of the disclosure.

Referring to FIGS. 17A and 17B, the flexible layer 172 according to various embodiments may include, on the second face 172b of the second portion 1722, a DDIC 173, a fingerprint sensor 174, and one or more pressure sensors 175, which may be disposed in close proximity to one another, or may be disposed to be spaced apart from each other. For example, a pair of pressure sensors 175 may be disposed in the form of enclosing the fingerprint sensor 174, and the DDIC 173 may be disposed in close proximity to the pressure sensor 175. However, these components may be disposed in various forms without being limited to that described above.

The second portion 1722 according to various embodiments may include a first wiring t1 that electrically connects the touch screen display 171 to the DDIC 173, a second wiring t2 that connects the DDIC 173 to the AP, a third wiring t3 that electrically connects the pressure sensors 175 to the AP, and a fourth wiring t4 that connects the fingerprint sensor 174 to the AP.

For example, for the signal transmission/reception relationship via each of the first to fourth wirings t1 to t4, reference may be made to FIG. 10.

Figure 18A:
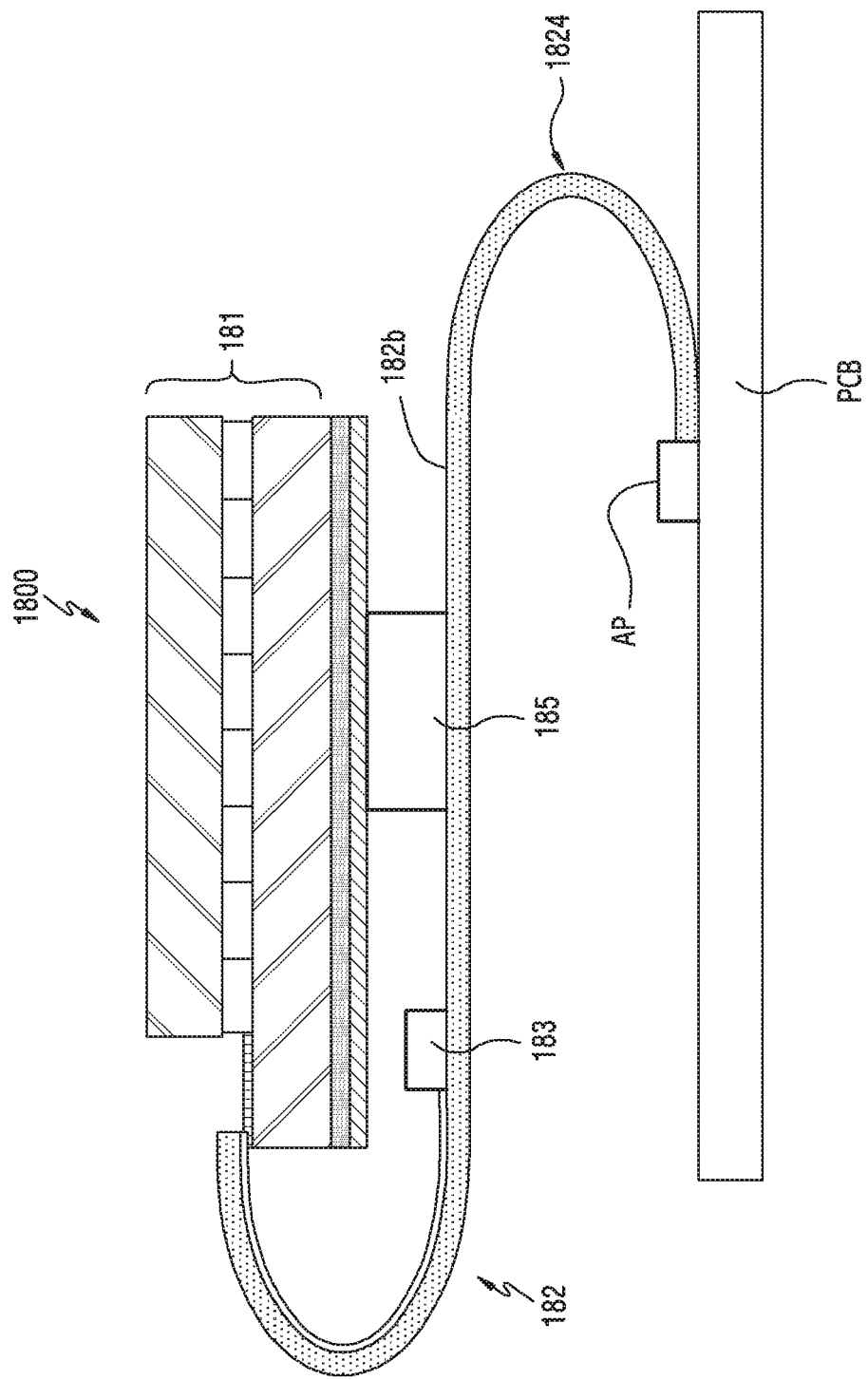
FIG. 18A is a cross-sectional view illustrating an electronic device in which a display and sensors are disposed according to various embodiments of the disclosure.

FIG. 18A is a cross-sectional view illustrating an electronic device in which a display and sensors are disposed according to various embodiments of the disclosure.

Referring to FIG. 18A, the electronic device 1800 according to various embodiments is the same as the electronic device illustrated in FIG. 15, except for an additional configuration in which a flexible layer 182 is electrically connected to the AP of the PCB via an auxiliary flexible layer 1824. Thus, a description of the same configuration will be omitted for avoiding redundant description. For example, the auxiliary flexible layer 1824 may include a film or a flexible circuit board with a wiring.

Figure 18B:
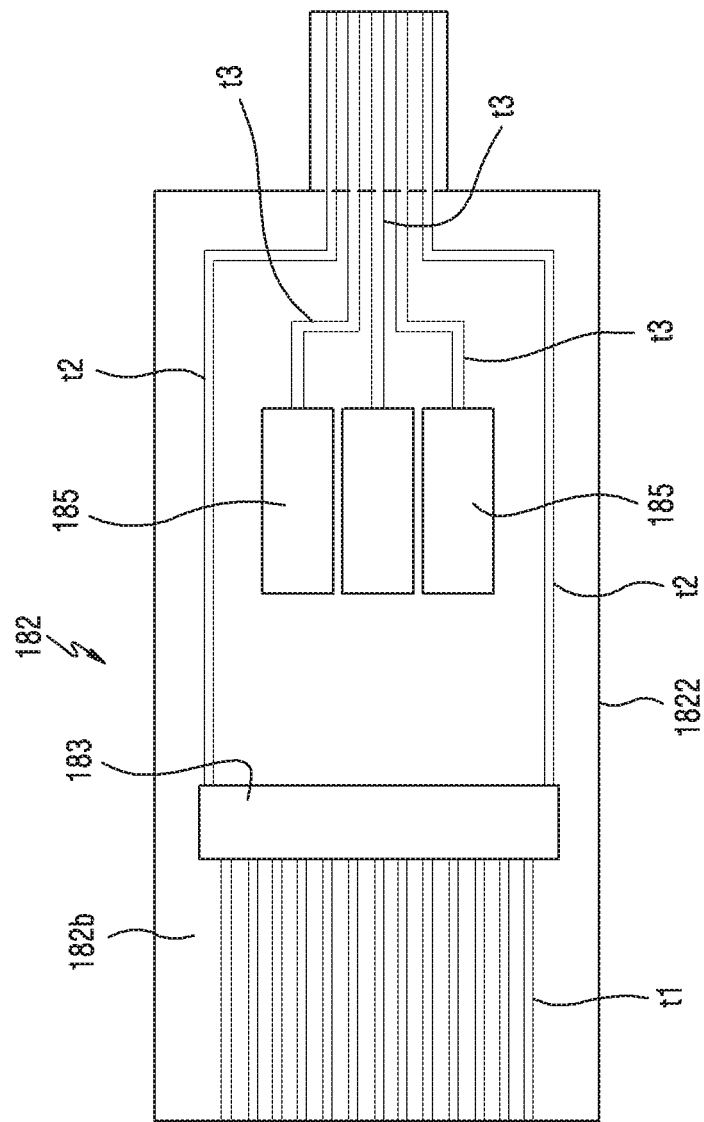
FIG. 18B is a plan view illustrating a DDIC and sensors disposed on a flexible layer and a wiring (traces) thereof according to various embodiments of the disclosure.

FIG. 18B is a plan view illustrating a DDIC and sensors disposed on a flexible layer according to various embodiments and a wiring (traces) thereof of the disclosure.

Referring to FIGS. 18A and 18B, the flexible layer 182 according to various embodiments may include, on the second face 182b of the second portion 1822, a DDIC 183 and one or more pressure sensors 185, which may be disposed in close proximity to each other, or may be disposed to be spaced apart from each other. For example, the DDIC 183 may be disposed in close proximity to the pressure sensor 185, and respective pressure sensors 185 may be disposed to be spaced apart from each other to be in close proximity to each other. However, these components may be disposed in various forms without being limited to that described above.

The flexible layer 182 according to various embodiments may include a first wiring t1 that electrically connects the touch screen display 181 to the DDIC 183, a second wiring t2 that connects the DDIC 183 to the AP, and a third wiring t3 that electrically connects each of the pressure sensors 175 to the AP. For example, for the signal transmission/reception relationship via each of the first to third wirings t1 to t3, reference may be made to FIG. 10.

Figure 19A:
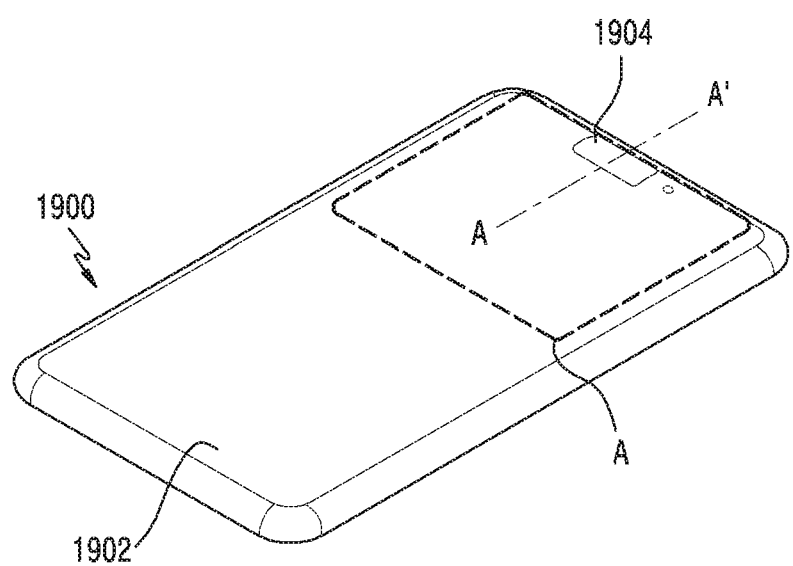
FIG. 19A is a perspective view illustrating the rear face of an electronic device according to various embodiments of the disclosure.

FIG. 19A is a perspective view illustrating the rear face of an electronic device according to various embodiments of the disclosure.

Referring to FIG. 19A, in an electronic device 1900 according to various embodiments, a fingerprint sensor and a pressure sensor may be disposed in close proximity to the rear face (back cover), for example, to the second plate 1902.

According to various embodiments, in the electronic device 1900, the fingerprint sensor and the pressure sensor may be disposed in a predetermined region A of the second plate 1902. For example, the predetermined region A may be the upper end region or the upper region of the second plate 1902 of the electronic device 1900.

According to various embodiments, a transparent member 1904 (transparent window) may be disposed in the predetermined region A, so that the optical operation of the fingerprint sensor can be performed.

Figure 19B:
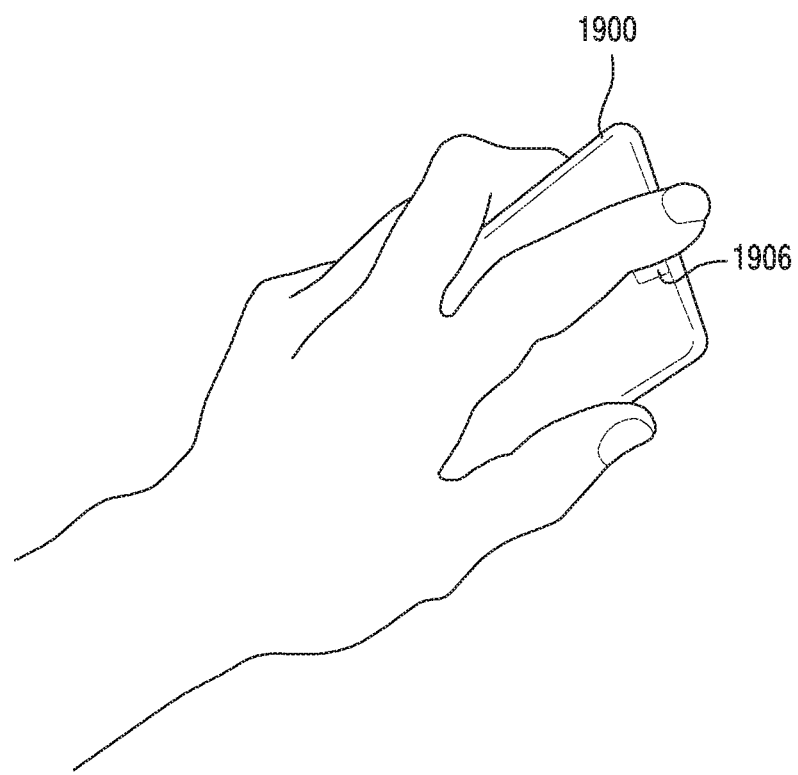
FIG. 19B is a view illustrating a state of touching a fingerprint sensor disposed on the rear face of an electronic device according to various embodiments of the disclosure.

FIG. 19B is a view illustrating a state of touching a fingerprint sensor disposed on the rear face of an electronic device according to various embodiments of the disclosure.

Referring to FIG. 19B, the electronic device 1900 according to various embodiments is provided with the fingerprint sensor illustrated in FIG. 19A. A home key 1906 is disposed in a predetermined region, and the fingerprint sensor is placed on the home key 1906.

Figure 20:
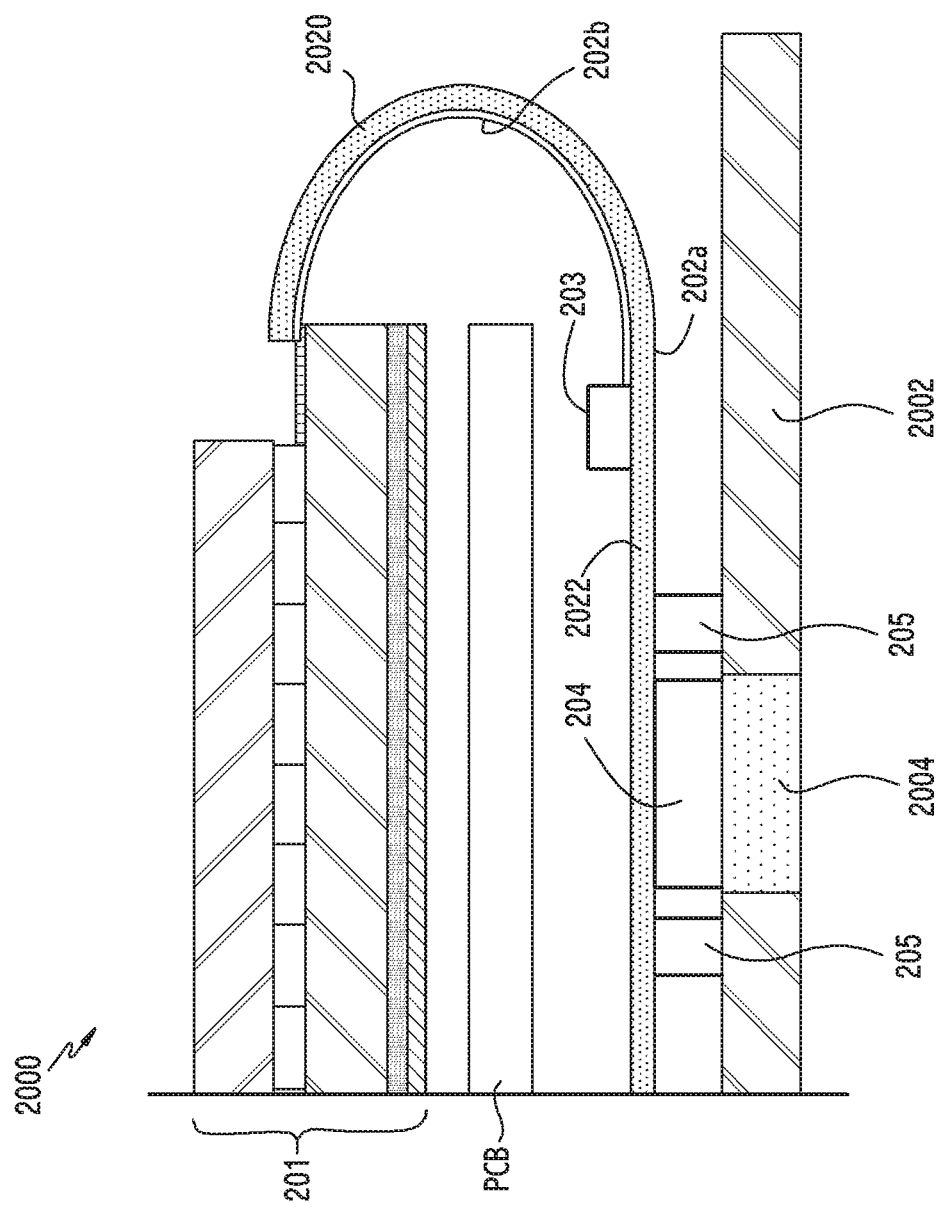
FIG. 20 is a cross-sectional view taken along line A-A' in FIG. 19A according to various embodiments of the disclosure.

FIG. 20 is a cross-sectional view taken along line A-A' in FIG. 19A according to various embodiments of the disclosure.

Referring to FIG. 20, an electronic device 2000 according to various embodiments may include a display 201, a flexible layer 202, a DDIC 203, a pressure sensor 205, a fingerprint sensor 204, and a back cover 2002.

The configuration for the display 201 and the flexible layer 202 according to various embodiments may be the same as or similar to the structure of the display 41 and the flexible layer 42, which have already been illustrated in FIG. 4. Thus, a detailed description thereof will be omitted for avoiding redundant description.

The flexible layer 202 according to various embodiments is bent in the downward direction of the PCB in a bent first portion 2020 and extends in the direction parallel to the back cover 2002 side, so that a second portion 2022 may be disposed to face the back cover 2002. In accordance with the arrangement of the second portion 2022 of the flexible layer, the fingerprint sensor 204 and at least one pressure sensor 205 may be interposed between the second portion 2022 and the back cover 2002.

According to various embodiments, the fingerprint sensor 204 may be interposed between the first face 202*a* and the back cover 2002 in the second portion 2022 of the flexible layer. Further, the fingerprint sensor 204 may be disposed so as to have a gap with the inner face of the back cover 2002, or may be disposed in close contact with the inner face of the back cover 2002. A portion of the back cover 2002, which is in close contact with the fingerprint sensor 204, may be configured with a transparent member 2004 for optical operation (e.g., light reception/light emission operation) of the fingerprint sensor 204. The transparent member 2004 may be disposed so that at least a portion of the transparent member 2004 is exposed to the back cover 2002. For example, the transparent member 2004 may be made of a glass material or a synthetic resin.

According to various embodiments, the pressure sensor 205 may be interposed between the first face 202*a* and the back cover 2002 in the second portion 2022 of the flexible layer. The pressure sensor 205 may be disposed in close proximity to the fingerprint sensor 204, and may be disposed in close contact with the inner face of the back cover 202*a*. One or more pressure sensors 205 may be disposed to enclose at least a portion of the fingerprint sensor 204.

According to various embodiments, the DDIC 203 may be disposed on the second face 202*b* in the second portion 2022 of the flexible layer. The DDIC 203 may be interposed between the PCB and the second portion 2022 of the flexible layer or between the PCB and the back cover 2002. For example, the DDIC 203 may be disposed in close proximity to the pressure sensors 205 and the finger print sensor 204 on a face different from the first face 202*a*, on which the pressure sensors 205 and the fingerprint sensor 204 are mounted.

Figure 21:
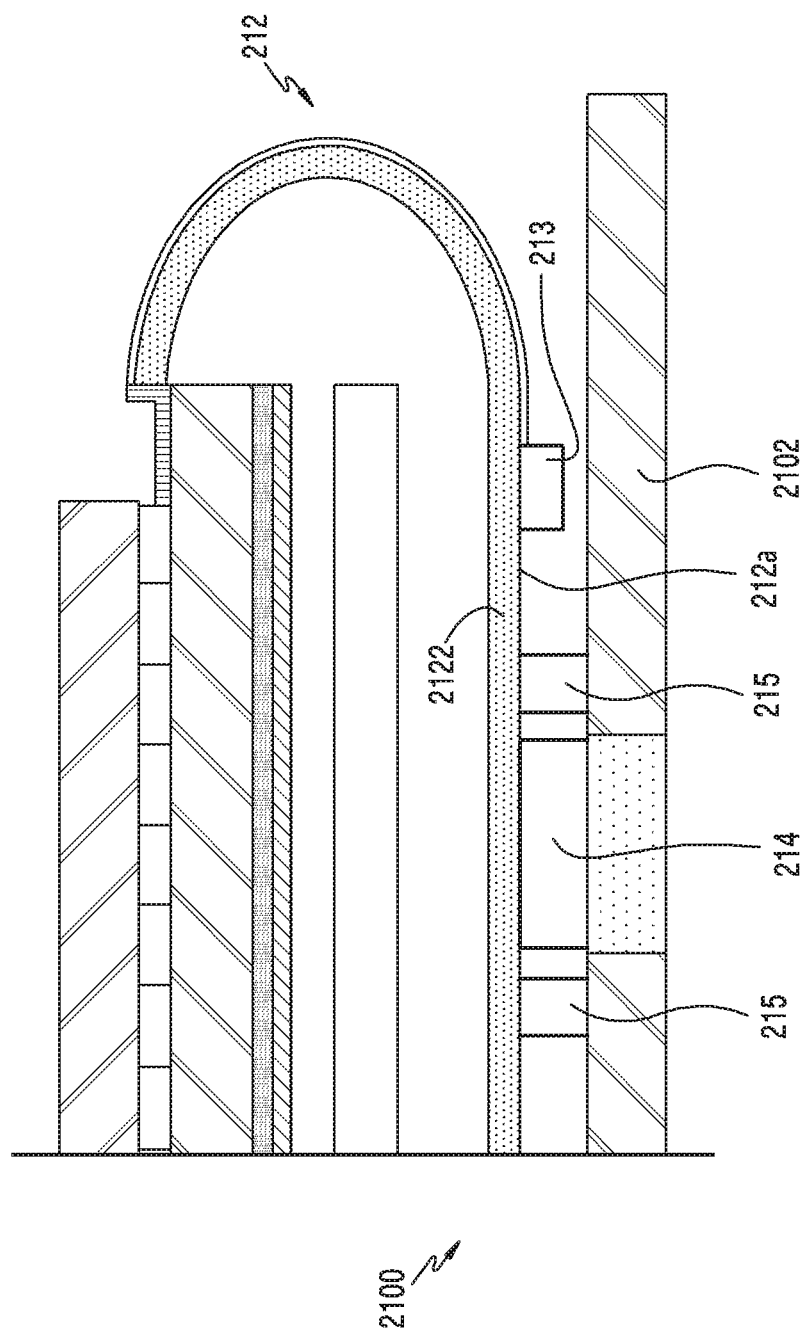
Figure 22:
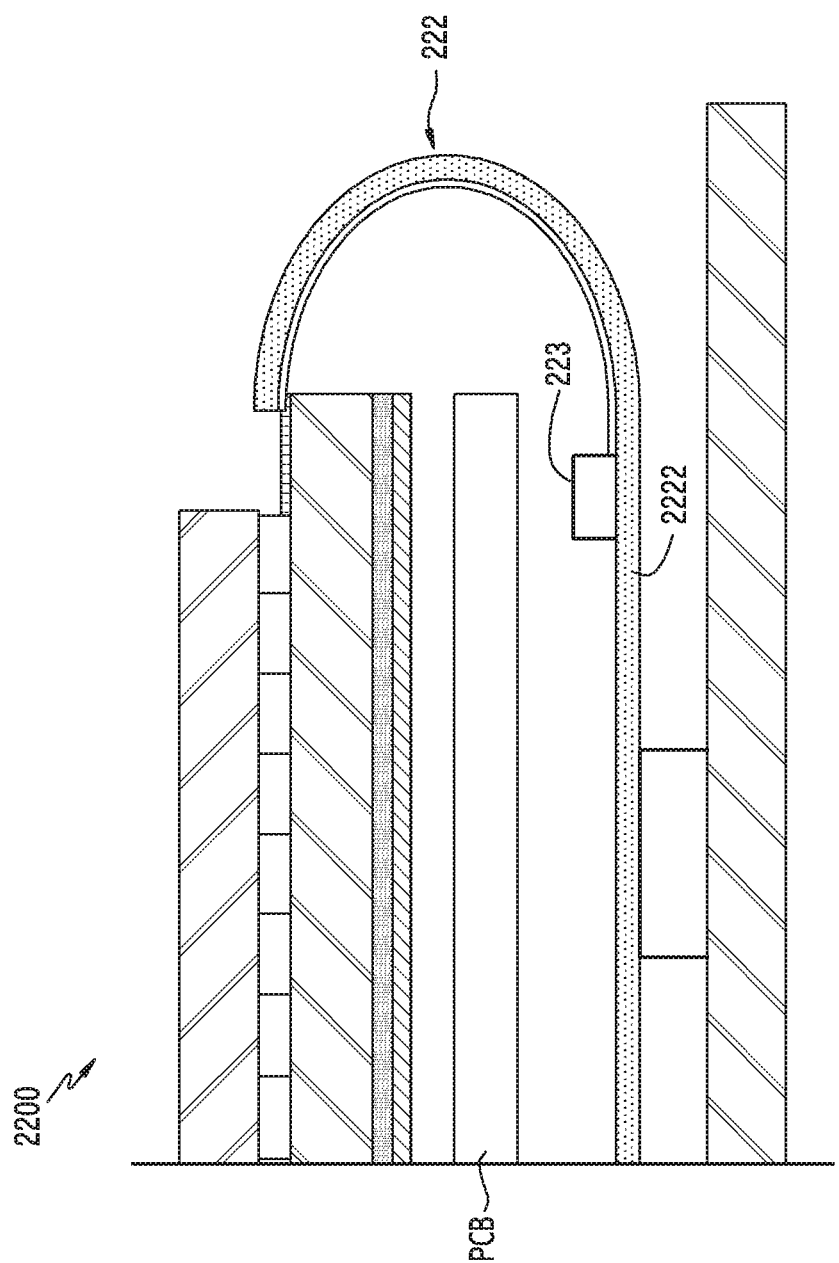

FIGS. 21, 22, and 23 are cross-sectional views each illustrating an electronic device in which a display and sensors are disposed according to various embodiments of the disclosure.

Referring to FIG. 21, the electronic device 2100 according to various embodiments may be the same as or similar to the electronic device 2000 illustrated in FIG. 20, except for the disposed position of the DDIC 213. Therefore, a description of the same or similar configuration will be omitted for avoiding redundant description.

In the electronic device 2100 according to various embodiments, the DDIC 213 may be disposed on the first face 212*a* of the flexible layer while being mounted on the second portion 2122 of the flexible layer 212. The DDIC 213 may be located under the second portion 2122 of the flexible layer. In addition, the DDIC 213 may also be disposed on the first face 212*a* which is the same as the face, on which the fingerprint sensor 214 and the pressure sensors 215 are mounted, and may be disposed in close proximity to the fingerprint sensor 214 and the pressure sensors 215 and to face the back cover 2102.

Referring to FIG. 22, the electronic device 2200 according to various embodiments may be the same as or similar to the electronic device 2000 illustrated in FIG. 20, except that only the pressure sensors 225 are mounted on the second face 2222 of the flexible layer 222 and the fingerprint sensor is not mounted thereon. Therefore, a description of the same or similar configuration will be omitted for avoiding redundant description. According to various embodiments, the pressure sensors 225 may be disposed on the face of the second portion 2222 of the flexible layer in close proximity to the DDIC 223. The DDIC 223 may be disposed to be directed toward the PCB.

Referring to FIG. 23, the electronic device 2300 according to various embodiments may be the same as or similar to the electronic device 2200 illustrated in FIG. 22, except for the disposed position of the DDIC 233 in the second portion 2322 of the flexible layer 232. Therefore, a description of the same or similar configuration will be omitted for avoiding redundant description. In the second portion 2322 of the flexible layer according to various embodiments, the DDIC 233 may be disposed on the first face 232*a*. The DDIC 233 may be disposed to face downward to be directed toward the back cover 2302. In addition, the DDIC 233 may be disposed in close proximity to the pressure sensor 235 so as not to overlap the pressure sensor 235.

Figure 24A:
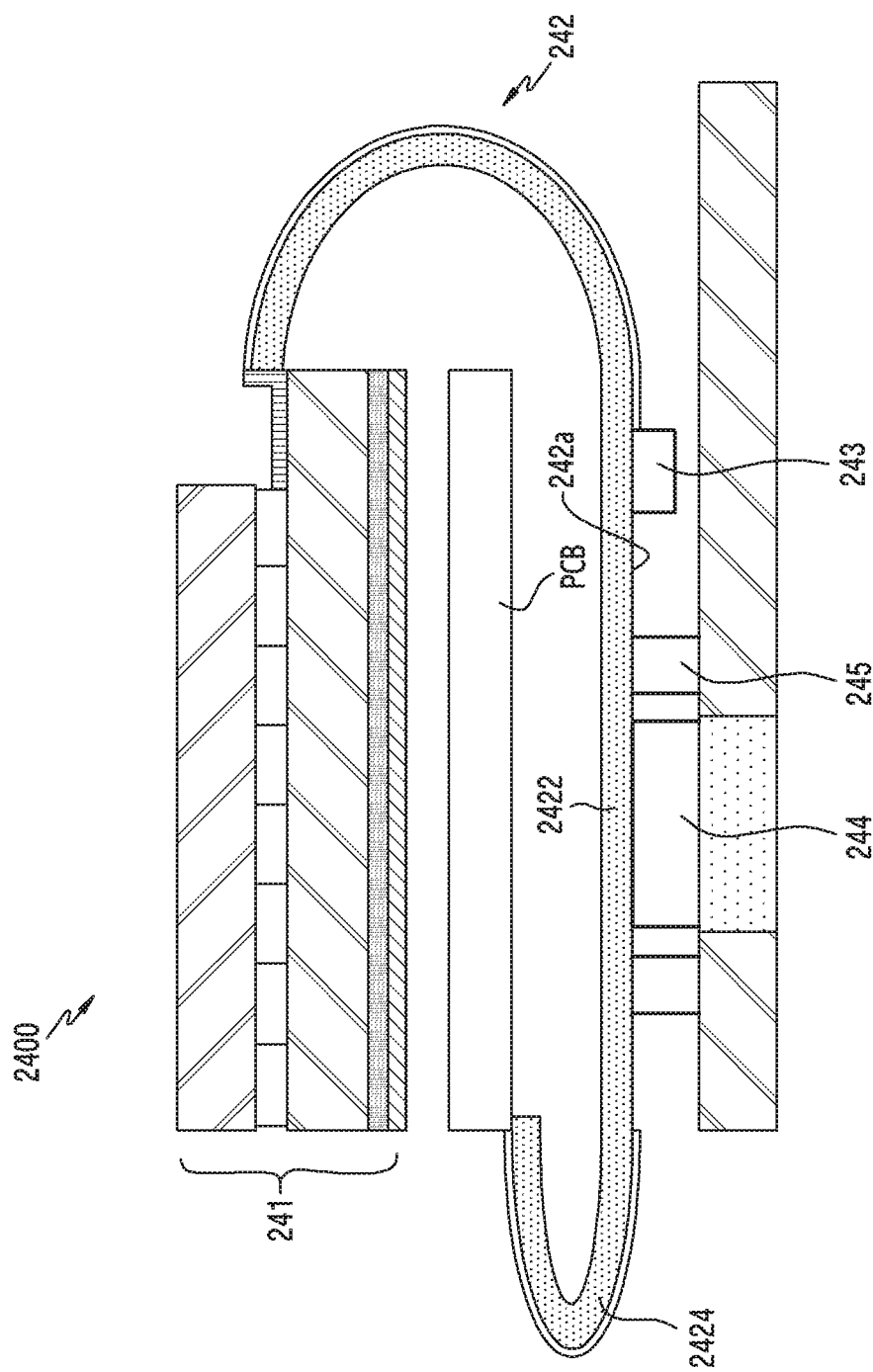
FIG. 24A is a cross-sectional view illustrating an electronic device in which a display and sensors are disposed according to various embodiments of the disclosure.

FIG. 24A is a cross-sectional view illustrating an electronic device in which a display and sensors are disposed according to various embodiments of the disclosure.

Referring to FIG. 24A, the electronic device 2400 according to various embodiments may be the same as or similar to the electronic device 2100 illustrated in FIG. 21, except for an additional configuration in which a flexible layer 242 is electrically connected to the PCB via an auxiliary flexible layer 2424. Thus, a description of the same or similar configuration will be omitted for avoiding redundant description. The flexible layer 242 may be electrically connected to the first face of the PCB or the second face opposite the first face via the auxiliary flexible layer 2424.

Figure 24B:
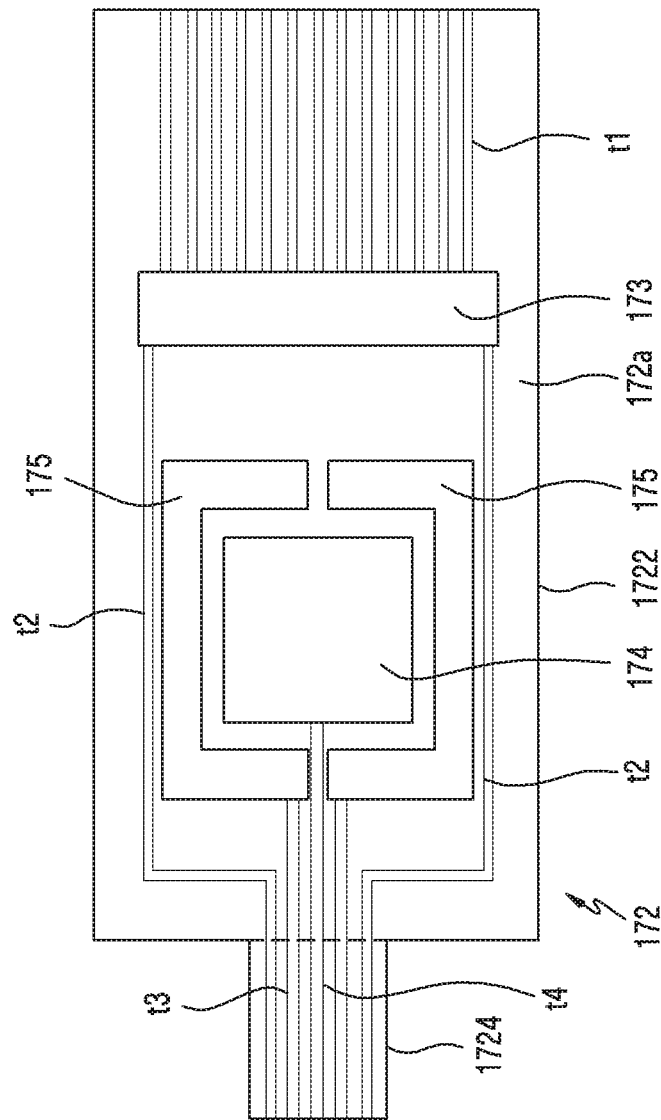
FIG. 24B is a plan view illustrating a DDIC and sensors disposed on a flexible layer and a wiring (traces) thereof according to various embodiments of the disclosure.

FIG. 24B is a plan view illustrating a DDIC and sensors disposed on a flexible layer according to various embodiments and a wiring (traces) thereof of the disclosure.

Referring to FIG. 24B, the flexible layer 242 according to various embodiments may include, on the first face 242*a* of the second portion 2422, a DDIC 243, a fingerprint sensor 244, and one or more pressure sensors 245, which may be disposed in close proximity to each other, or may be disposed to be spaced apart from each other. For example, a pair of pressure sensors 245 may be disposed in the form of enclosing the fingerprint sensor 244, and the DDIC 243 may be disposed in close proximity to the pressure sensor 245. However, these components may be disposed in various forms without being limited to that described above. The fingerprint sensor 244, the pressure sensor 245, and the DDIC 243 may be connected to the PCB via the flexible layer 242 and the auxiliary flexible layer 2424.

The flexible layer 242 according to various embodiments may include a first wiring t1 that electrically connects the touch screen display 241 to the DDIC 243, a second wiring t2 that connects the DDIC 243 to the AP, a third wiring t3 that electrically connects the pressure sensors 245 to the AP, and a fourth wiring t4 that connects the fingerprint sensor 244 to the AP.

For example, for the signal transmission/reception relationship via each of the first to fourth wirings t1 to t4, reference may be made to FIG. 10.

Figure 25A:
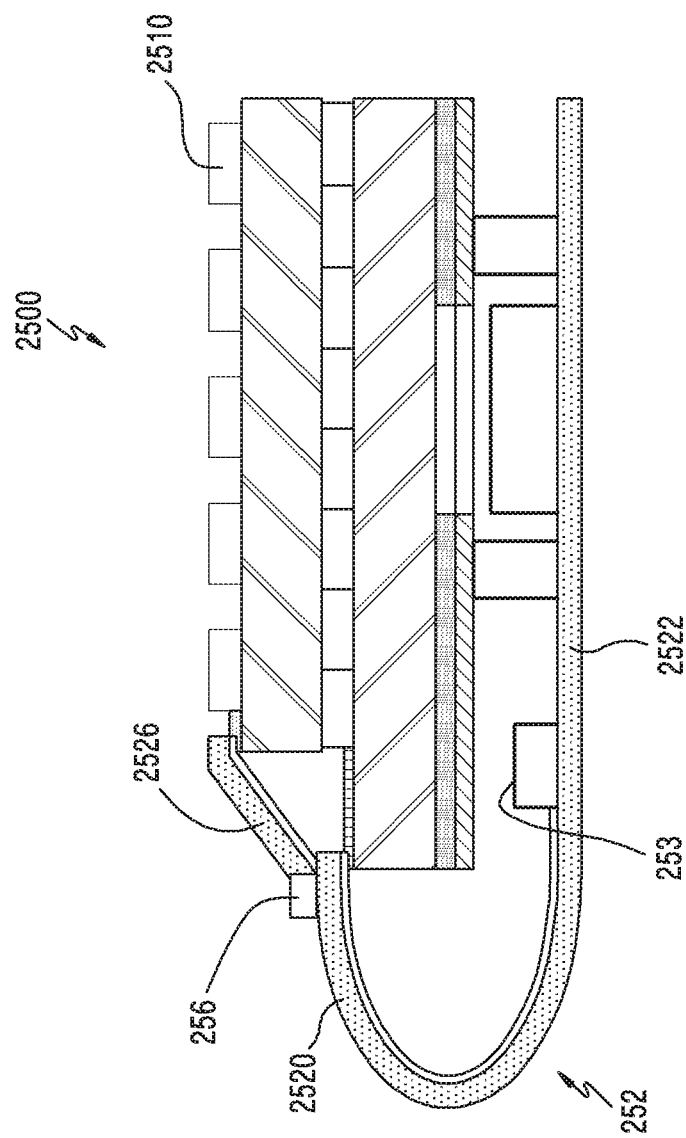
FIG. 25A is a cross-sectional view illustrating an electronic device in which a display and sensors are disposed according to various embodiments of the disclosure.
Figure 25B:
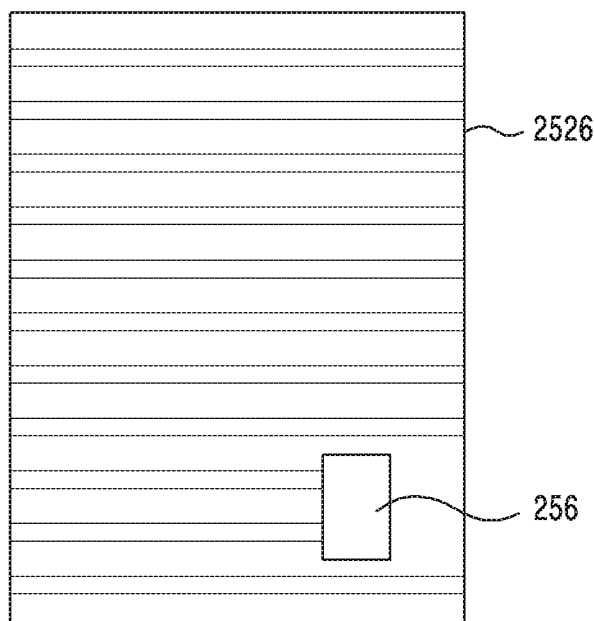
FIG. 25B is a plan view illustrating the arrangement state of the driving integrated circuit in FIG. 25A according to various embodiments of the disclosure.

FIG. 25A is a cross-sectional view illustrating an electronic device in which a display and sensors are disposed according to various embodiments of the disclosure. FIG. 25B is a plan view illustrating the arrangement state of the driving integrated circuit in FIG. 25A according to various embodiments of the disclosure.

Referring to FIGS. 25A and 25B, an electronic device 2500 according to various embodiments may be the same as or similar to the electronic device 1100 illustrated in FIG. 11, except for an additional configuration in which the display 251 includes a touch-sensitive panel 2510 and the touch-sensitive panel 2510 is connected to the first flexible layer 252. Thus, a description of the same or similar configuration will be omitted for avoiding redundant description.

The touch-sensitive panel 2510 according to various embodiments is electrically connected to, for example, one end of the first portion 2520 of the first flexible layer 251 via a second flexible layer 2526. In addition, a touch-driving integrated circuit 256 for driving the touch-sensitive panel 2510 may be mounted on an end of the first portion 2520 of the first flexible layer 252. However, the touch-driving integrated circuit 256 may be mounted on the second portion 2522 of the first flexible layer, and the touch driving integrated circuit 256 may be mounted in close proximity to the DDIC 253 or may be configured as an integrated chip in the DDIC 253. For example, the second flexible layer may be disposed linearly.

Figure 26A:
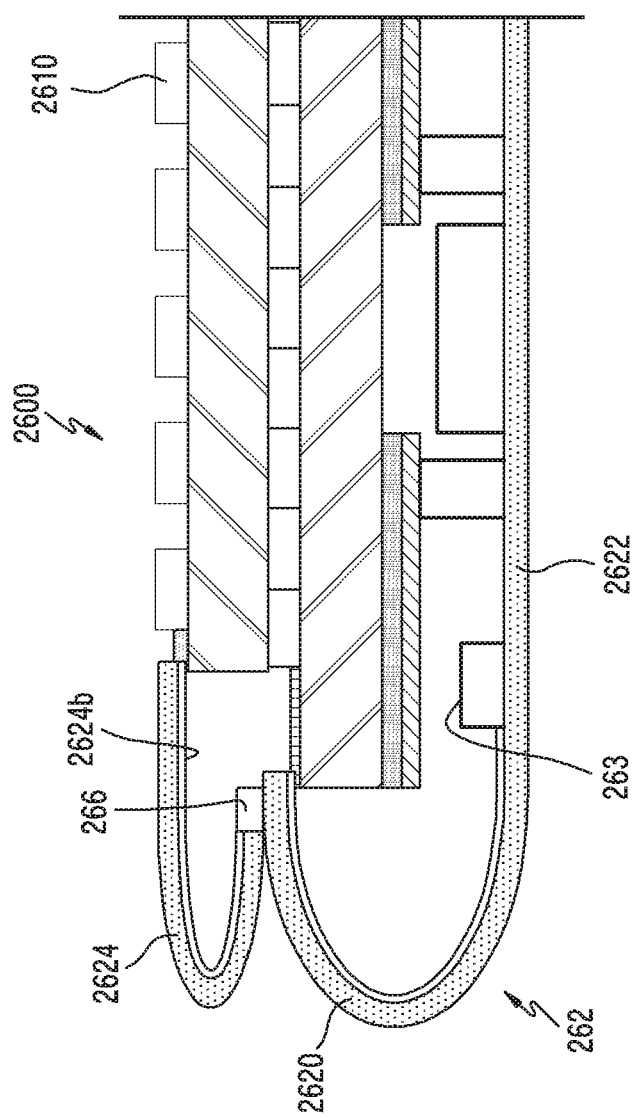
FIG. 26A is a cross-sectional view illustrating an electronic device in which a display and sensors are disposed according to various embodiments of the disclosure.
Figure 26B:
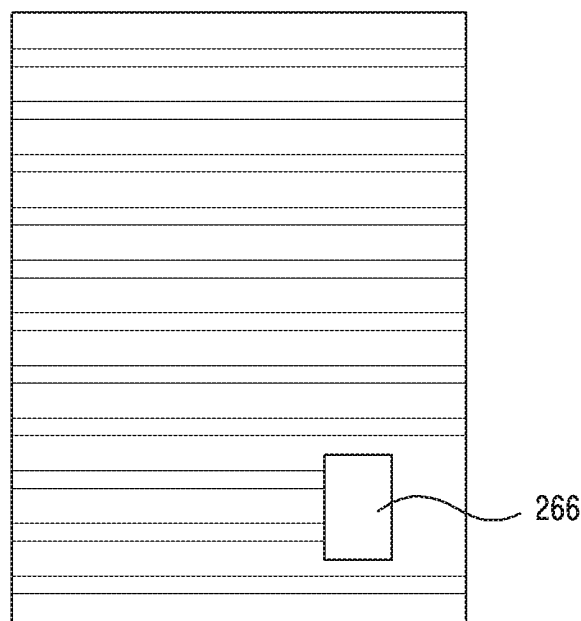
FIG. 26B is a plan view illustrating the arrangement state of the driving integrated circuit in FIG. 26A according to various embodiments of the disclosure.

FIG. 26A is a cross-sectional view illustrating an electronic device in which a display and sensors are disposed according to various embodiments of the disclosure. FIG. 26B is a plan view illustrating the arrangement state of the driving integrated circuit in FIG. 26A according to various embodiments of the disclosure.

Referring to FIGS. 26A and 26B, an electronic device 2600 according to various embodiments may be the same as or similar to the electronic device 2500 illustrated in FIG. 25A, except for the arrangement of a second flexible layer 2624 and a touch-driving integrated circuit 266. Thus, a description of the same or similar configuration will be omitted for avoiding redundant description.

A touch-sensitive panel 2610 according to various embodiments may be electrically connected to, for example, an end of the first portion 2620 of the first flexible layer 262 via a second flexible layer 2624. In addition, a touch-driving integrated circuit 266 for driving the touch-sensitive panel 2610 may be mounted on a second face 2624*b* of the second flexible layer 2624.

However, the touch-driving integrated circuit 266 may be mounted on the second portion 2622 of the first flexible layer 262, and the touch-driving integrated circuit 256 may be mounted in close proximity to the DDIC 263 or may be configured as a touch screen display driver integrated chip (TDDIC) in which functions are incorporated in the DDIC 263.

Figure 27:
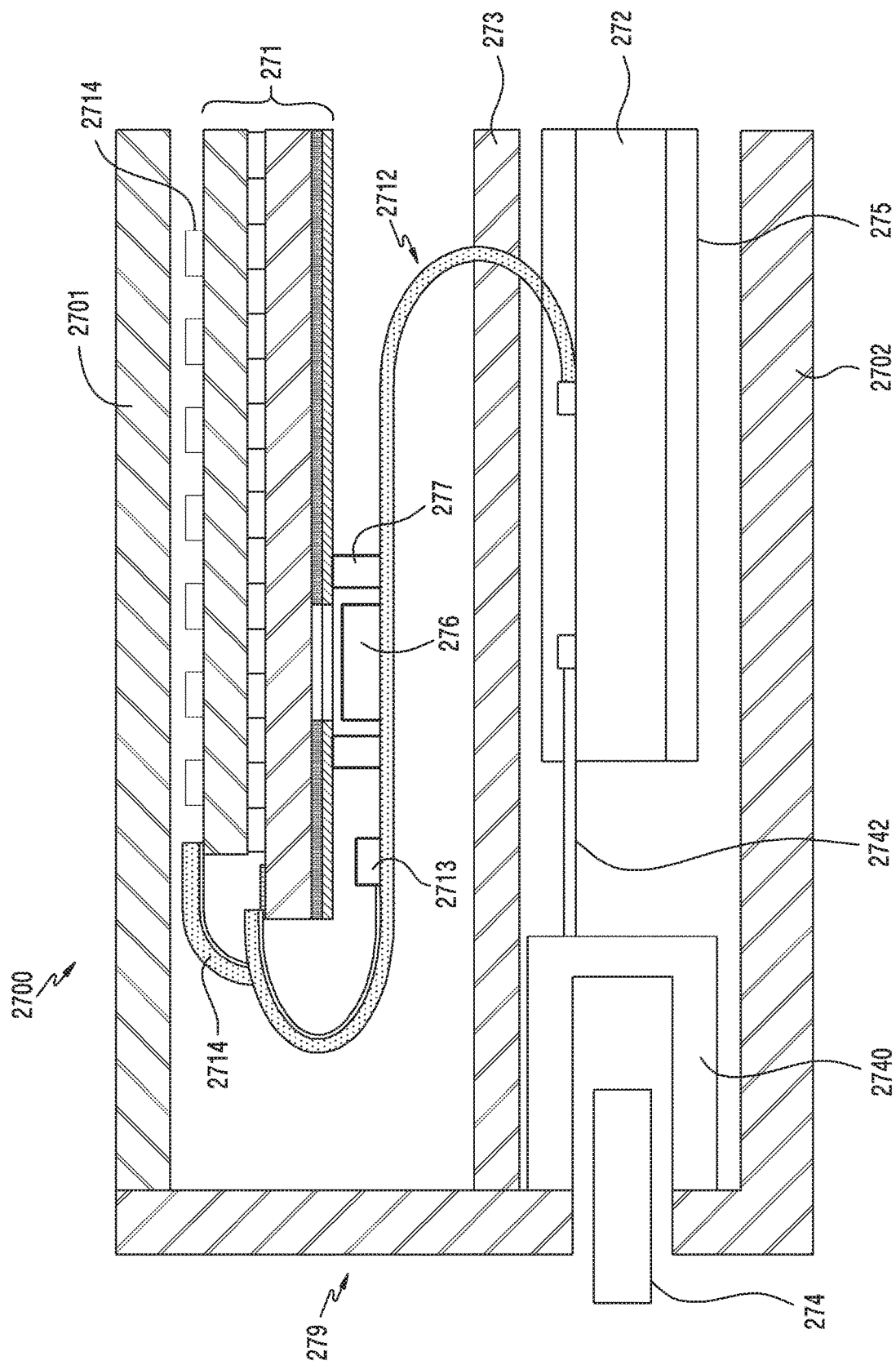
FIG. 27 is a cross-sectional view schematically illustrating a disposed state of components of an electronic device according to various embodiments of the disclosure.

FIG. 27 is a cross-sectional view schematically illustrating a disposed state of components of an electronic device according to various embodiments of the disclosure.

Referring to FIG. 27, an electronic device 2700 according to various embodiments may include a housing 279. The housing 279 according to various embodiments may include a display 271, a PCB 272, a support member 273, a universal serial bus (USB) connector 274, and the like.

The housing 279 according to various embodiments may include a first plate 2701 facing in a first direction and a second plate 2702 facing in a second direction opposite the first direction. For example, the first plate 2701 may be referred to as a front cover, a front window, or the like. The second plate 2702 may be referred to as a rear cover, a back cover, or the like. The display 271, the support member 273, the PCB 272, the USB connector 274, the battery 275, and the like may be interposed between the first and second plates 2701 and 2702 of the housing 270.

The detailed structure of the display 271 and the flexible layer 2712 according to various embodiments has already been described in detail with reference to FIG. 11, so a detailed description will be omitted for avoiding redundant description.

According to various embodiments, when the touch-sensitive panel 2714 is mounted, a data input operation may be performed on the display 271 through an operation such as a touch. When the touch-sensitive panel 2714 is mounted on the display 271, the display 271 may be referred to as a touch screen display and the DDIC 2713 may be referred to as a TDDIC 2713. The touch-sensitive panel 2714 may be electrically connected to a first portion of the flexible layer 2712 via an auxiliary flexible layer 2714, and may be electrically connected to the TDDIC 2713. The flexible layer 2712 allows the TDDIC 2713 to be electrically connected to the PCB 272.

The support member 273 according to various embodiments may be coupled with the housing 279 such that one side supports the display 271 and the other side supports the PCB 272. The support member 273 may be made of a metallic material, an alloy, or a synthetic resin material. For example, the support member 273 may include a bracket or a support frame.

The USB connector 274 according to various embodiments is detachably attached to a connector connection portion 2740 and may be electrically connected to the PCB 272 by a separate connector flexible circuit 2742.

The battery 275 according to various embodiments may be supported by the support member 273, and may be disposed parallel to the PCB 272 without overlapping the PCB 272 (see FIG. 2). For example, the PCB 272 may be formed in an "L" shape, a "U" shape, or the like when viewed from above.

Figure 28:
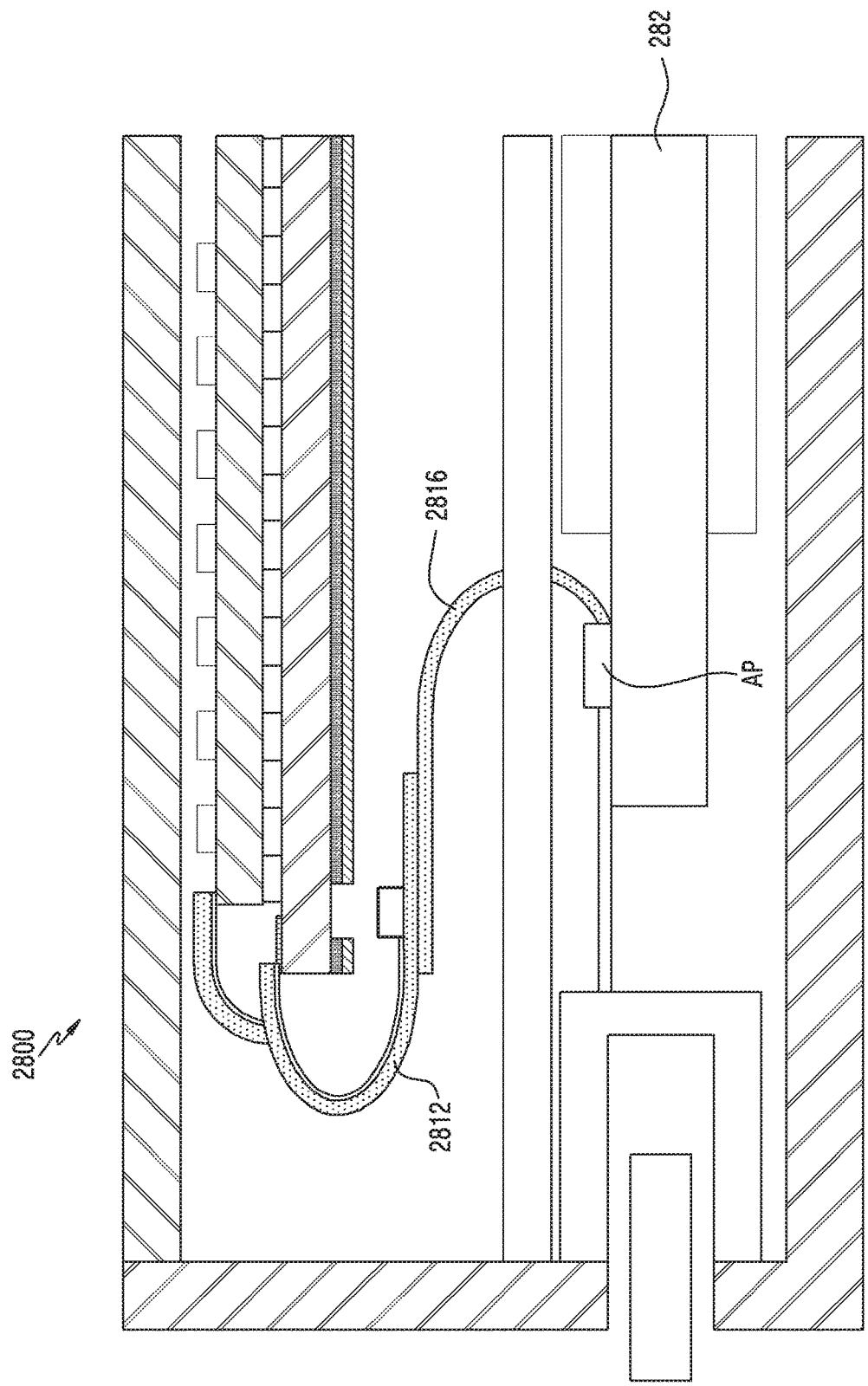
FIG. 28 is a cross-sectional view schematically illustrating a disposed state of components of an electronic device according to various embodiments of the disclosure.

FIG. 28 is a cross-sectional view schematically illustrating a disposed state of components of an electronic device according to various embodiments of the disclosure.

Referring to FIG. 28, an electronic device 2800 according to various embodiments may be the same as or similar to the electronic device 2700 illustrated in FIG. 27, except for a structure in which the fingerprint sensor 276 and the pressure sensor 277 are removed and a flexible layer 2812 is electrically connected to a PCB 282 via an auxiliary flexible layer 2816. Thus, a description of the same or similar configuration will be omitted for avoiding redundant description.

The first flexible layer 2812 according to various embodiments may include an auxiliary flexible layer 2816 that electrically connects the first flexible layer 2812 to the PCB 282. One end of the auxiliary flexible layer 2816 may be connected to the flexible layer 2812 and may be connected to a portion of the PCB 282, e.g., an AP.

Figure 29A:
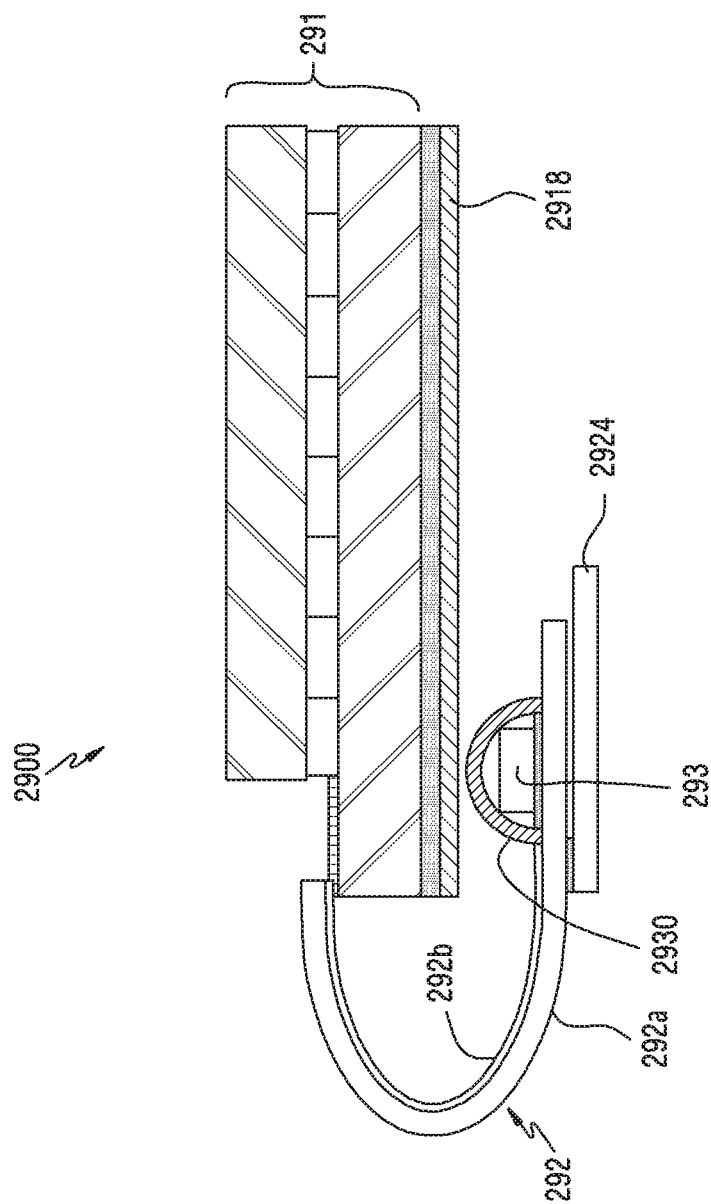
FIG. 29A is a cross-sectional view illustrating an electronic device in which a display and sensors are disposed according to various embodiments of the disclosure.

FIG. 29A is a cross-sectional view illustrating an electronic device in which a display and sensors are disposed according to various embodiments of the disclosure.

Referring to FIG. 29A, an electronic device 2900 according to various embodiments may be the same as or similar to the electronic device 1100 illustrated in FIG. 11, except for the arrangement structure of a DDIC 293 and the arrangement structure of an added second flexible circuit 2924. Thus, a description of the same or similar configuration will be omitted for avoiding redundant description.

The DDIC 293 according to various embodiments may be configured to be enclosed by a protective member 2930. For example, the protective member 2930 may be attached to the outer face of the DDIC 293 so as to be protected from the display 291.

The second flexible layer 2924 according to various embodiments may be attached to the first flexible layer 292 via an ACF to be electrically connected. The DDIC 293 may be disposed on the second face 292*b* of a first portion of the first flexible layer 292, and at least a portion of the second flexible layer 2924 may be attached to the first face 292*a* of the first portion. The DDIC 293 may be disposed so as to overlap the second flexible layer 2924.

Figure 29B:
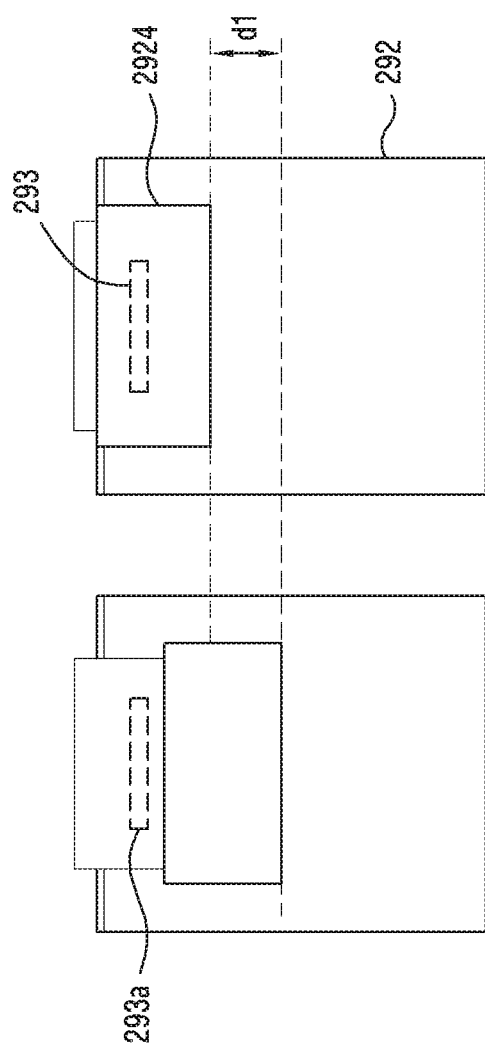
FIG. 29B is a rear view illustrating a DDIC and sensors disposed on a flexible layer and a wiring (traces) thereof according to various embodiments of the disclosure.

FIG. 29B is a rear view illustrating a DDIC and sensors disposed on a flexible layer according to various embodiments and a wiring (traces) thereof of the disclosure.

Referring to FIG. 29B, in comparison with a comparative embodiment (left figure) in which the DDIC 293a and the second flexible layer 2924a are disposed parallel to each other without overlapping each other, a structure in which the DDIC is disposed to overlap the second flexible layer according to various embodiments (right figure) may improve the efficiency of component mounting space. Other components may be additionally mounted on the second flexible layer 2924 by an area according to a distance d1 illustrated in the drawing. For example, the second flexible layer 2924 may include a flexible circuit board.

The portion denoted by reference numeral 2918 may be a backing tape. The backing tape 2918 may include double-sided tape. The backing tape 2918 allows the display 291 to be attached to and to be supported by an unillustrated support structure (e.g., a bracket).

Figure 29C:
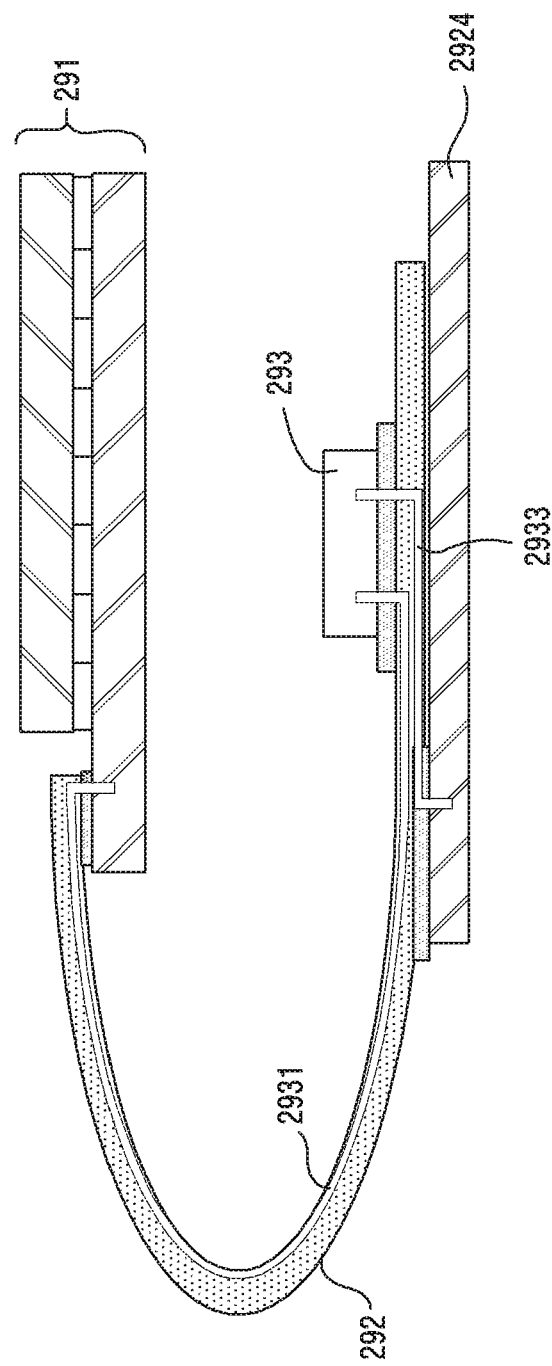
FIG. 29C is a cross-sectional view illustrating a wiring state of an electronic device in which a display and sensors are disposed according to various embodiments of the disclosure.

FIG. 29C is a cross-sectional view illustrating a wiring state of an electronic device in which a display and sensors are disposed according to various embodiments of the disclosure.

Referring to FIG. 29C, in the electronic device 2900 according to various embodiments, the display 291 may be electrically connected to the DDIC 293 mounted on the flexible layer 292 via a first wiring 2931, and the DDIC 293 may be electrically connected to the second flexible layer 2924 via the second wiring 2933. The first wiring may be an output wiring of the display, and the second wiring may be the input wiring of the display.

Figure 30A:
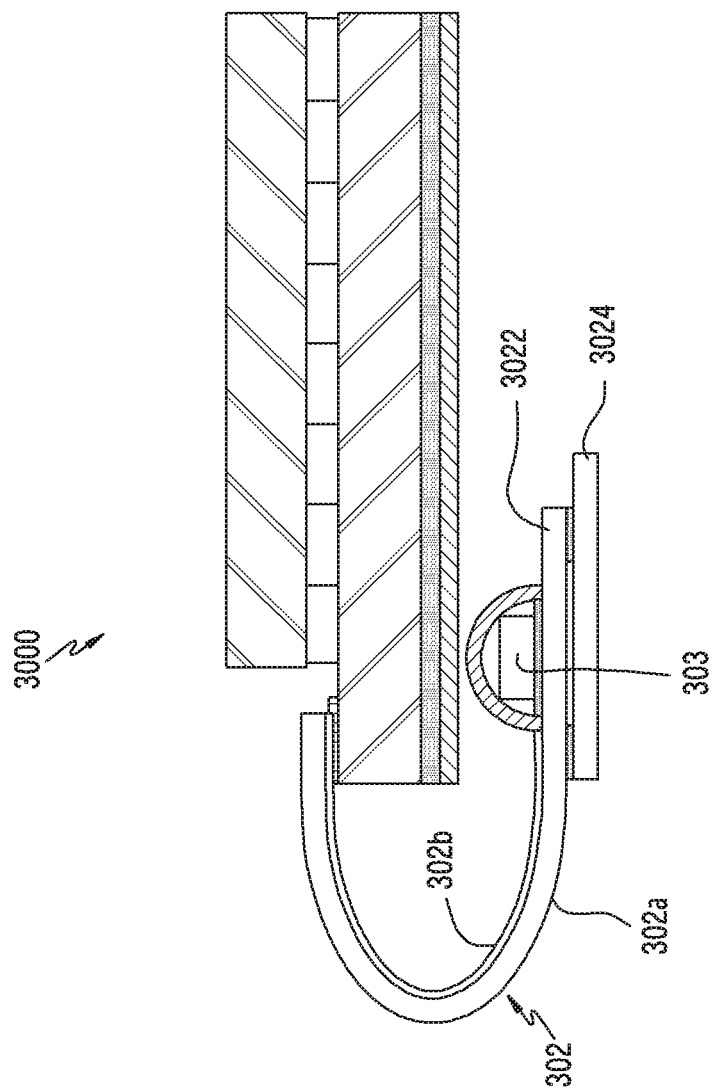
FIG. 30A is a cross-sectional view illustrating an electronic device in which a display and sensors are disposed according to various embodiments of the disclosure.

FIG. 30A is a cross-sectional view illustrating an electronic device in which a display and sensors are disposed according to various embodiments of the disclosure.

Referring to FIG. 30A, an electronic device 3000 according to various embodiments may be the same as or similar to the electronic device 2900 illustrated in FIG. 29A, except for the arrangement structure of an added second flexible circuit 3024. Thus, a description of the same or similar configuration will be omitted for avoiding redundant description.

The second flexible layer 3024 according to various embodiments may be attached to the first flexible layer 302 via first and second ACFs to be electrically connected. The DDIC 303 may be disposed on the second face 302b of a first portion 3022 of the first flexible layer 302, and at least a portion of the second flexible layer 3024 may be attached to the first face 302a of the second portion 3022. The DDIC 303 may be disposed so as to overlap the second flexible layer 3024.

Figure 30B:
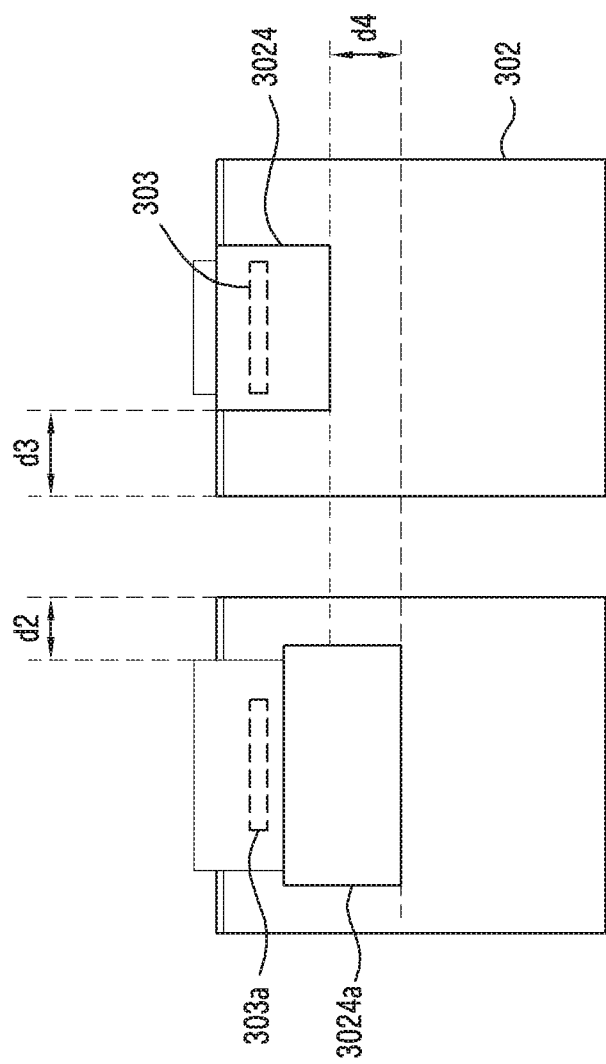
FIG. 30B is a rear view illustrating a DDIC and sensors disposed on a flexible layer and a wiring (traces) thereof according to various embodiments of the disclosure.

FIG. 30B is a rear view illustrating a DDIC and sensors disposed on a flexible layer according to various embodiments and a wiring (traces) thereof of the disclosure.

Referring to FIG. 30B, in comparison with a comparative embodiment (left figure) in which the DDIC 303a and the second flexible layer 3024a are disposed parallel to each other without overlapping each other, a structure in which the DDIC 303 is disposed to overlap the second flexible layer 3024 using first and second ACFs according to various embodiments (right figure) may improve the efficiency of component mounting space. Other components may be additionally mounted on the second flexible layer 3024 by an area generated as a second distance d3 according to one embodiment is increased over the first distance d2 of the illustrated structure according to the related art and a third distance d4 is secured. For example, the second flexible layer 3024 may include a film with a wiring or a flexible circuit board.

Figure 30C:
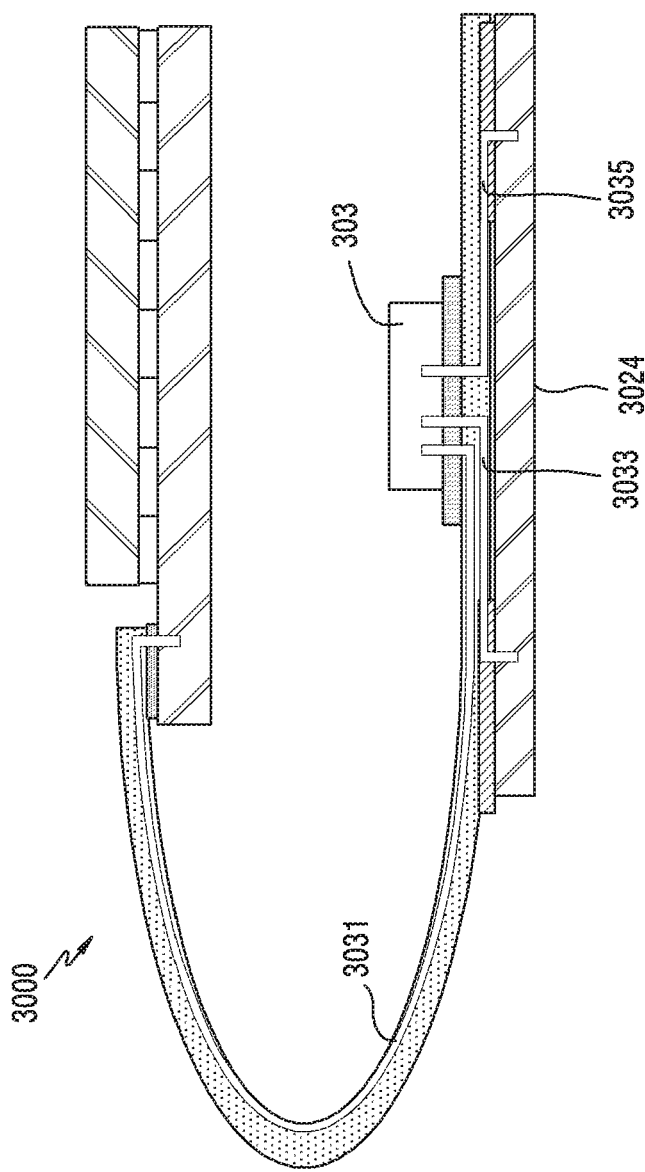
FIG. 30C is a cross-sectional view illustrating a wiring state of an electronic device in which a display and sensors are disposed according to various embodiments of the disclosure.

FIG. 30C is a cross-sectional view illustrating a wiring state of an electronic device in which a display and sensors are disposed according to various embodiments of the disclosure.

Referring to FIG. 30C, in the electronic device 3000 according to various embodiments, a display 301 may be electrically connected to the DDIC 303 mounted on the flexible layer 302 via a first wiring 3031, and the DDIC 303 may be electrically connected to the second flexible layer 3024 via second and third wirings 3033 and 3035. The first wiring 2431 is an output wiring of the display, and the second and third wirings 3033 and 3035 may be the input wirings of the display, respectively.

FIG. 31A is a cross-sectional view illustrating an electronic device in which a display and sensors are disposed according to various embodiments of the disclosure.

Referring to FIG. 31A, an electronic device 3100 according to various embodiments may be the same as or similar to the electronic device 2900 illustrated in FIG. 29A, except for the arrangement of a DDIC 313 and the arrangement of an added flexible circuit board 3124. Thus, a description of the same or similar configuration will be omitted for avoiding redundant description.

The DDIC 313 according to various embodiments is disposed on the first face 312a of the second portion 3122 of the flexible layer 312 via a first ACF 313a, and the flexible circuit board 3124 may be disposed on the second surface 312b of the second portion of the flexible layer 312 via a second ACF 313b. The DDIC 313 may be disposed so as to overlap the flexible circuit board 3124.

Figure 31B:
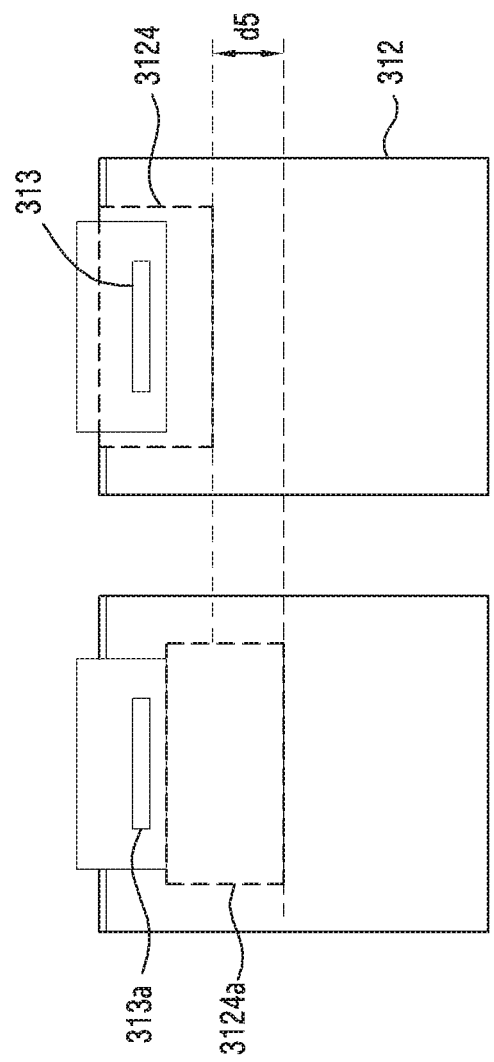
FIG. 31B is a rear view illustrating a DDIC and sensors disposed on a flexible layer and a wiring (traces) thereof according to various embodiments of the disclosure.

FIG. 31B is a rear view illustrating a DDIC and sensors disposed on a flexible layer according to various embodiments and a wiring (traces) thereof of the disclosure.

Referring to FIG. 31B, in comparison with a comparative embodiment (left figure) in which the DDIC 313a and the flexible circuit board 3124a are disposed parallel to each other without overlapping each other, a structure in which the DDIC 313 is disposed to overlap the flexible circuit board 3124 according to various embodiments (right figure) may improve the efficiency of component mounting space. Other components may be additionally mounted by an area generated by a distance d5 illustrated in the drawing.

Figure 32:
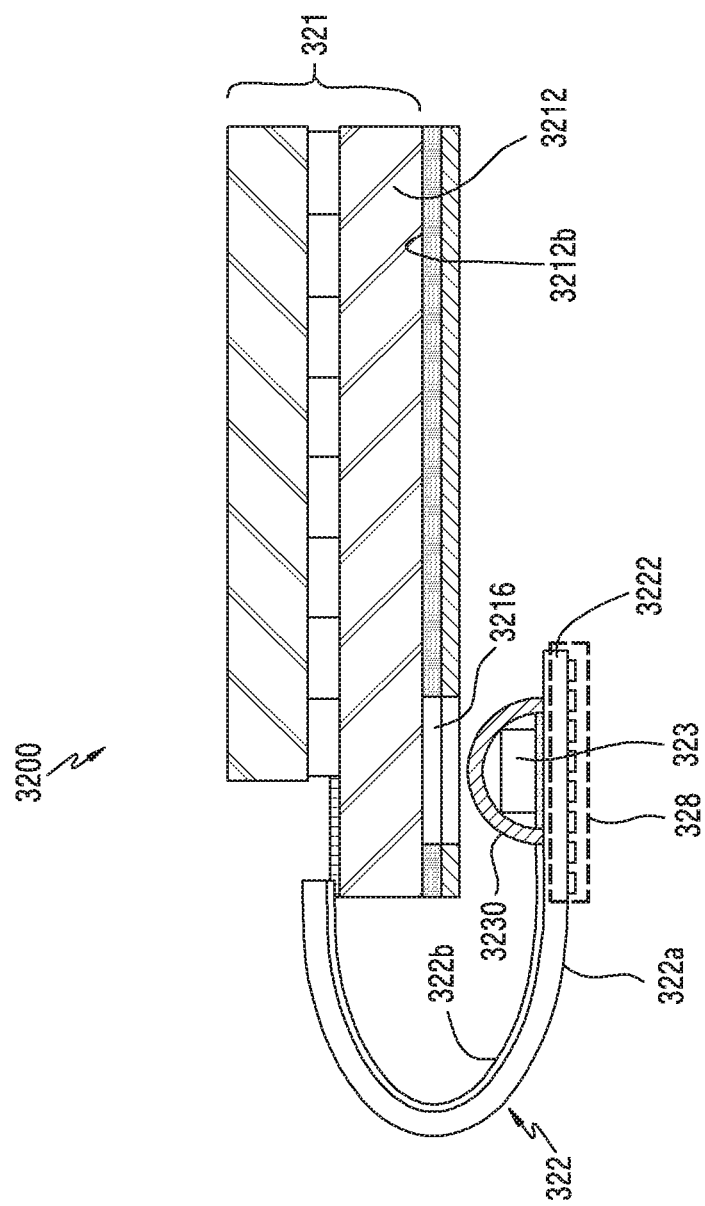
FIG. 32 is a cross-sectional view illustrating an electronic device in which a display and sensors are disposed according to various embodiments of the disclosure.

FIG. 32 is a cross-sectional view illustrating an electronic device in which a display and sensors are disposed according to various embodiments of the disclosure.

Referring to FIG. 32, an electronic device 3200 according to various embodiments may be the same as or similar to the electronic device 2900 illustrated in FIG. 29A, except for the arrangement structure of the DDIC 323 and the additional component mounting structure. Therefore, a description of the same or similar configuration will be omitted for avoiding redundant description.

The display 321 according to various embodiments may include, on the second face of the second glass plate, a dielectric layer, a heat dissipation plate, and a backing tape. An opening 3216 may be formed in a form in which the dielectric layer, a heat dissipation plate, and the backing tape, which face the DDIC 323, are partially removed. For example, the opening 3216 allows the DDIC 323 to directly face the second face 3212b of the second glass plate 3212. A portion of the DDIC 323 to which the protective member 3230 is attached may be accommodated by the opening 3216.

The DDIC 323 may be disposed on the second face 322b of the second portion 3222 of the flexible layer 322 according to various embodiments and a plurality of components 328 may be disposed on the first face 322a of the second portion 3222 of the flexible layer 322. The DDIC 323 and the plurality of components 328 may be opposed to each other. At least a portion of the DDIC 323 according to various embodiments may be disposed to overlap the plurality of components 328.

Figure 33A:
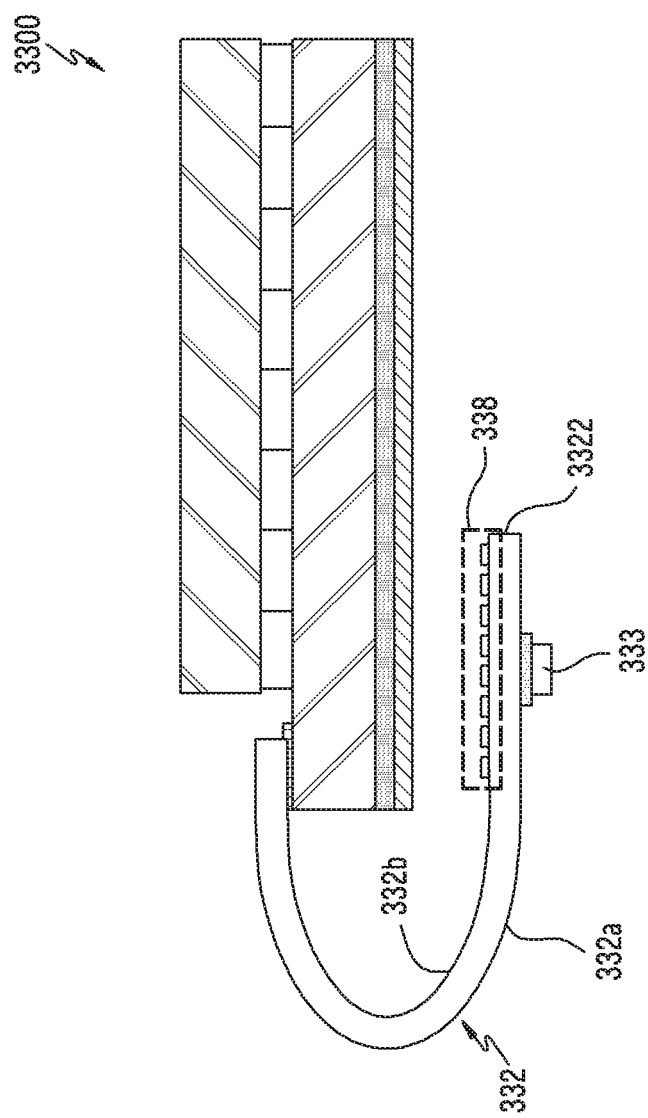
FIG. 33A is a cross-sectional view illustrating an electronic device in which a display and sensors are disposed according to various embodiments of the disclosure.

FIG. 33A is a cross-sectional view illustrating an electronic device in which a display and sensors are disposed according to various embodiments of the disclosure.

Figure 33B:
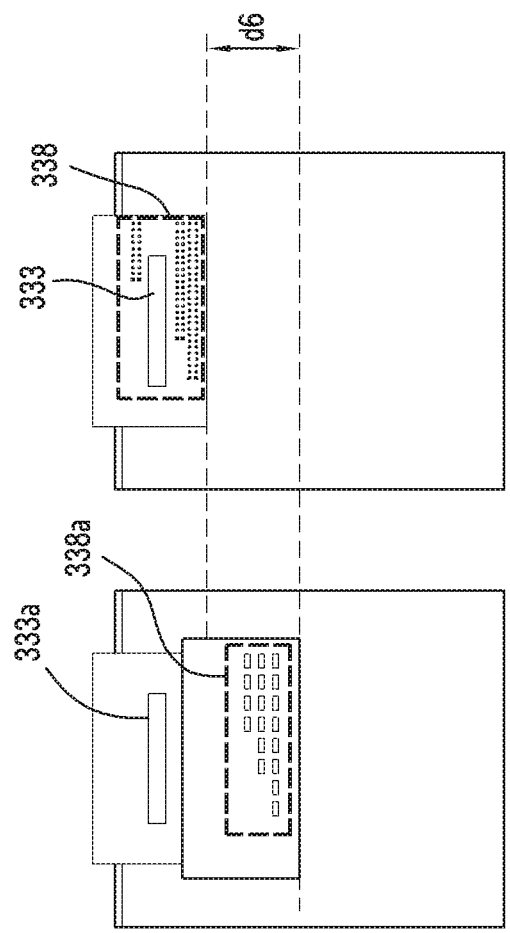
FIG. 33B is a rear view illustrating a DDIC and sensors disposed on a flexible layer and a wiring (traces) thereof according to various embodiments of the disclosure.

Referring to FIGS. 33A and 33B, an electronic device 3300 according to various embodiments may be the same as or similar to the electronic device illustrated in FIG. 29A, except for the arrangement structure of the DDIC 333 and a mounting structure for the additional components 338. Therefore, a description of the same or similar configuration will be omitted for avoiding redundant description.

The DDIC 333 is disposed on the first face 332a of the second portion 3322 of the flexible layer 332 according to various embodiments and the plurality of components 338 may be disposed on the second face 332b of the second portion 3322 of the flexible layer 332. The DDIC 333 and the plurality of components 338 may be opposed to each other. For example, the second flexible layer 332 may be configured with a film with a wiring or a flexible circuit board.

At least a portion of the DDIC 333 according to various embodiments may be disposed to overlap the plurality of components 338.

FIG. 33B is a rear view illustrating a DDIC and sensors disposed on a flexible layer according to various embodiments and a wiring (traces) thereof of the disclosure.

Referring to FIG. 33B, in comparison with a comparative embodiment (left figure) in which the DDIC 333a and the plurality of components 338a are disposed parallel to each other without overlapping each other, a structure in which the DDIC 333 is disposed to overlap the plurality of components 338 according to various embodiments (right figure) may improve the efficiency of component mounting space. Other components may be additionally mounted by an area generated by a distance d6 illustrated in the drawing.

FIG. 34A is a cross-sectional view illustrating an electronic device in which a display and sensors are disposed according to various embodiments of the disclosure.

Referring to FIG. 34A, an electronic device 3400 according to various embodiments may be the same as or similar to the electronic device 2900 illustrated in FIG. 29A, except for the arrangement structure of the DDI. Therefore, a description of the same or similar configuration will be omitted for avoiding redundant description.

The display 341 according to various embodiments may include, on the second face 342b of the second glass plate 3412, a dielectric layer, a heat dissipation plate, and a backing tape. A portion of the dielectric layer, the heat dissipation plate, and the backing tape facing the DDIC 343 surrounded by the protective member 3430 may be removed so as to form an opening 3460 (e.g., a hole). For example, the opening 3460 allows the DDIC 343 to directly face the second face 341b of the second glass plate. A portion of the DDIC 343 to which the protective member 3430 is attached may be accommodated by the opening 3460. This structure can provide a gap between the second glass plate 3412 and the DDIC 343.

The DDIC 343 may be disposed on the second face 342b of the second portion 3422 of the flexible layer 342 according to various embodiments and a flexible circuit board may be disposed on the first face 342a of the second portion 3422 of the flexible layer 342. At least a portion of the DDIC 343 according to various embodiments may be disposed to overlap the flexible circuit board 34.

Figure 34B:
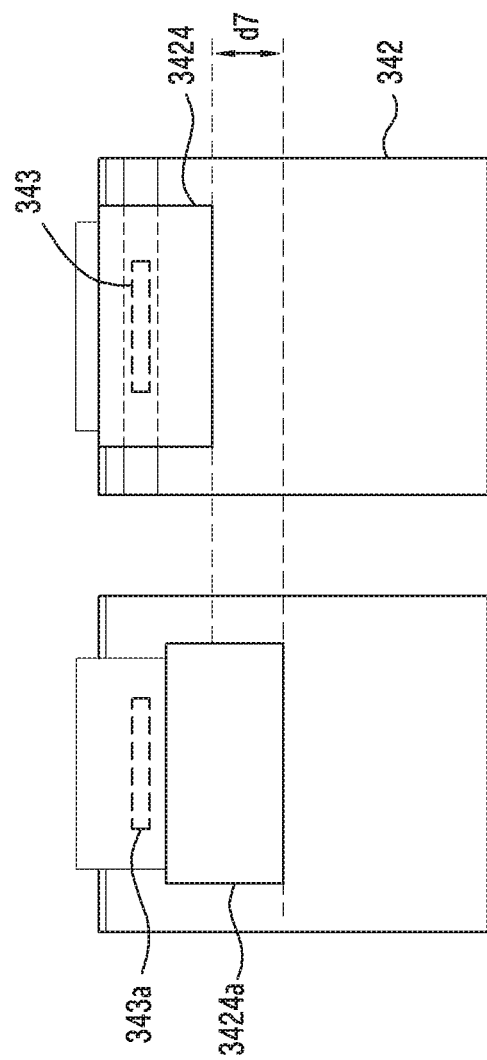
FIG. 34B is a rear view illustrating a DDIC and sensors disposed on a flexible layer and a wiring (traces) thereof according to various embodiments of the disclosure.

FIG. 34B is a rear view illustrating a DDIC and sensors disposed on a flexible layer according to various embodiments and a wiring (traces) thereof of the disclosure.

Referring to FIG. 34B, in comparison with a comparative embodiment (left figure) in which the DDIC 343a and the flexible circuit board 3424a are disposed parallel to each other without overlapping each other, a structure in which the DDIC 343 is disposed to overlap the flexible circuit board 3424 according to one embodiment (right figure) may improve the efficiency of component mounting space. Other components may be additionally mounted by an area generated by a distance d7 illustrated in the drawing.

Figure 35B:
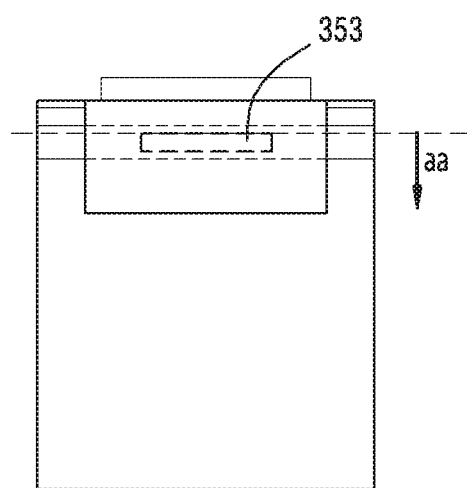
FIG. 35B is a rear view illustrating a DDIC and sensors disposed on a flexible layer and a wiring (traces) thereof according to various embodiments of the disclosure.

FIG. 35A is a cross-sectional view illustrating an electronic device in which a display and sensors are disposed according to various embodiments of the disclosure. FIG. 35B is a rear view illustrating a DDIC and sensors disposed on a flexible layer according to various embodiments of the disclosure and a wiring (traces) thereof.

Referring to FIGS. 35A and 35B, an electronic device 3500 according to various embodiments may be the same as or similar to the electronic device 3400 illustrated in FIG. 34A, except for the disposed position of the DDIC 353. Therefore, a description of the same or similar configuration will be omitted for avoiding redundant description.

When the DDIC 353 according to various embodiments is located in the active area aa of the display 351, a portion of the backing tape 357 facing the DDIC 353 may be removed for improved visibility. An opening 357a may be formed in the portion where the backing tape 357 is removed.

According to various embodiments, an electronic device may include: a housing including a first plate and a second plate facing away from the first plate; a touch screen display including a first glass plate, a second glass plate, and an OLED layer interposed between the first plate and the second plate, wherein the first glass plate is interposed between the first plate of the housing and the OLED layer, and wherein the second glass plate includes a first surface facing toward the first plate and a second surface facing toward second plate; a flexible layer including a first portion connected to the first surface of the second glass plate and bent around an edge of the second glass plate toward the second plate of the housing, and a second portion extending from the first portion and interposed between the second glass plate and the second plate of the housing; a DDIC mounted on a first surface of the second portion of the flexible layer; and a PCB including a portion mounted on a second surface of the second portion of the flexible layer, wherein the DDIC is interposed between the portion of the PCB and the second surface of the second glass plate.

According to various embodiments, the DDIC may be interposed between the second surface of the second glass plate and the second portion of the flexible layer.

According to various embodiments, the electronic device may further include a pressure sensor mounted on the second portion of the flexible layer, and a fingerprint sensor mounted on the second portion of the flexible layer.

According to various embodiments, the pressure sensor may be interposed between the second surface of the second glass plate and the second portion of the flexible layer.

According to various embodiments, the fingerprint sensor may be interposed between the second surface of the second glass plate and the second portion of the flexible layer.

According to various embodiments, the DDIC may be interposed between the second glass plate and the second portion of the flexible layer.

According to various embodiments, the pressure sensor may be interposed between the second plate and the second portion of the flexible layer.

According to various embodiments, the fingerprint sensor may be interposed between the second plate and the second portion of the flexible layer.

According to various embodiments, the display may further include a dielectric layer disposed on a second surface of the second glass plate, and a heat dissipation plate disposed on a bottom surface of the dielectric layer, and an opening may be formed in a portion of each of the heat dissipation plate and the dielectric layer facing the fingerprint sensor, so that an optical operation of the fingerprint sensor is enabled.

According to various embodiments, the fingerprint sensor may be disposed to face the second plate, and a portion of the second plate facing the fingerprint sensor is made of a transparent member, so that an optical operation of the fingerprint sensor may be performed.

According to various embodiments, the pressure sensor may be disposed in close proximity to the fingerprint sensor, and may be disposed in close contact with the second plate.

According to various embodiments, the second portion of the flexible layer may be connected to a wiring of the DDIC by an ACF, and the wired DDIC may be connected to the PCB by a second FPCB, and at least a portion of the second flexible circuit board may be disposed to overlap the DDI.

According to various embodiments, the DDIC may be a protective member attached to an outer surface thereof to be protected from the display.

According to various embodiments, at least a portion of the first portion of the flexible layer may be attached to the second surface of the second glass plate by an ACF.

According to various embodiments, an electronic device may include: a housing including a first plate facing in a first direction, and a second plate facing in a second direction, which is opposite to the first direction, wherein the first plate and the second plate face away from each other; a touch screen display including a first film, a second film, and an OLED layer interposed between the first film and the second film, wherein the first film is interposed between the first plate of the housing and the OLED layer, and wherein the second film includes a first face facing toward the first plate and a second face facing toward second plate; a first flexible circuit board including a first portion connected to the first face of the second film and bent around an edge of the second film toward the second plate of the housing, and a second portion extending from the first portion and interposed between the second film and the second plate of the housing; a touch screen DDIC mounted on the second portion; and a PCB disposed to be spaced apart from and parallel to the second portion.

According to various embodiments, the second portion of the first flexible circuit board may be electrically connected to the PCB by a second flexible circuit board, and at least a portion of the second flexible circuit board may be disposed to overlap the touch screen DDIC mounted on the first flexible circuit board.

According to various embodiments, the touch screen DDIC may be interposed between the second face of the second film and the second portion of the first flexible circuit board or between the second portion of the first flexible circuit board and the second plate.

According to various embodiments, an electronic device may further include: at least one pressure sensor mounted on the second portion of the first flexible circuit board; and a fingerprint sensor disposed on the second portion of the first flexible circuit board in close proximity to the pressure sensor to be surrounded by the pressure sensor.

According to various embodiments, the pressure sensor may be interposed between the second face of the second film and the second portion of the first flexible circuit board or between the second portion of the first flexible circuit board and the second plate, and the fingerprint sensor may be interposed between the second face of the second film and the second portion of the first flexible circuit board or between the second portion of the first flexible circuit board and the second plate.

According to various embodiments, the touch screen display may be made of a rigid material or a flexible material.

According to various embodiments, the touch screen display may be constituted in any one of a flat shape, a curved shape, a rollable shape, and a foldable shape.

According to various embodiments, the PCB may be disposed in close proximity to a battery and parallel to the battery without overlapping the battery.

The computer readable recoding medium includes magnetic media such include magnetic media, such as a hard disk, a floppy disk and a magnetic tape, optical media, such as a compact disc read only memory (CD-ROM) and a digital versatile disc (DVD), magneto-optical media, such as a floptical disk, and a hardware device specially configured to store and execute a program command, such as a read only memory (ROM), a random access memory (RAM) and a flash memory. In addition, the program instructions may include high class language codes, which can be executed in a computer by using an interpreter, as well as machine codes made by a compiler. The aforementioned hardware device may be configured to operate as one or more software modules in order to perform the operation of the disclosure, and vice versa.

The programming module according to the disclosure may include one or more of the aforementioned components or may further include other additional components, or some of the aforementioned components may be omitted. Operations executed by a module, a programming module, or other component elements according to various embodiments of the disclosure may be executed sequentially, in parallel, repeatedly, or in a heuristic manner. Furthermore, some operations may be executed in a different order or may be omitted, or other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a housing that forms a rear surface of the electronic device and at least a portion of a side surface of the electronic device;
a display that forms at least a portion of a front surface of the electronic device;
a flexible layer connected to an end of the display, the flexible layer including:
a first portion where the flexible layer is connected to the display, a second portion extending from the first portion, wherein the second portion is bent around the display, and
a third portion extending from an end of the second portion and disposed between the display and the rear surface of the housing, the third portion including a first surface facing the display and a second surface facing the rear surface;
a display driver integrated circuit (DDIC) mounted on the second surface of the third portion of the flexible layer, the display driver integrated circuit (DDIC) electrically connected to the display; and
a flexible printed circuit board (FPCB) connected with the flexible layer on the second surface of the third portion of the flexible, layer,
   wherein a portion of the FPGB connected to the flexible layer is farther from the second portion of the flexible layer than the display driver integrated circuit (DDIC), and
   wherein the FPCB extends toward the second portion of the flexible layer from the portion of the FPCB such that the FPCB overlaps a portion of the third portion of the flexible layer between the second portion of the flexible layer and the display driver integrated circuit (DDIC).

2. The electronic device of claim 1, further comprising:
a pressure sensor mounted on the second portion of the flexible layer; and
a fingerprint sensor mounted on the third portion of the flexible layer.

3. The electronic device of claim 2, wherein the pressure sensor is interposed between the display and the third portion of the flexible layer.

4. The electronic device of claim 2, wherein the fingerprint sensor is interposed between the display and the third portion of the flexible layer.

5. The electronic device of claim 2,
wherein the display further comprises:
   a dielectric layer, and
      a heat dissipation plate disposed on a bottom surface of the dielectric layer, and wherein an opening is formed in a portion of each of the heat dissipation plate and the dielectric layer facing the fingerprint sensor, so that an optical operation of the fingerprint sensor is enabled.

6. The electronic device of claim 2,
wherein the fingerprint sensor is disposed to face the rear surface of the housing, and
wherein an area of the rear surface of the housing facing the fingerprint sensor is made of a transparent member, so that an optical operation of the fingerprint sensor is performed.

7. The electronic device of claim 6, wherein the pressure sensor is disposed in close proximity to the fingerprint sensor, and is disposed in close contact with the rear surface of the housing.

8. The electronic device of claim 1,
wherein the third portion of the flexible layer is connected to a wiring of the DDIC by an anisotropic conductive film (ACF).

9. The electronic device of claim 1, wherein the DDIC has a protective member attached to an outer surface thereof to be protected from the display.

10. The electronic device of claim 1, wherein at least a portion of the first portion of the flexible layer is attached to the display by an ACF.

11. The electronic device of claim 1, the FPCB extending in a direction opposite to the DDIC from the portion of the FPCB connected to the third portion of the flexible layer.

12. The electronic device of claim 1, wherein the FPCB including an area facing the rear surface of the housing for mounting a plurality of electronic components.

13. The electronic device of claim 1, further comprising a conductive sheet attached to the display between the display and the third portion of the flexible layer, the conductive sheet including copper.

14. The electronic device of claim 1, wherein the FPCB does not overlap with the DDIC.

* * * * *